(12) United States Patent
Facchetti et al.

(10) Patent No.: US 9,876,183 B2
(45) Date of Patent: Jan. 23, 2018

(54) CHARGE-TRANSPORTING METAL OXIDE-POLYMER BLEND THIN FILMS

(71) Applicants: Northwestern University, Evanston, IL (US); Polyera Corporation, Skokie, IL (US)

(72) Inventors: Antonio Facchetti, Chicago, IL (US); Tobin J. Marks, Evanston, IL (US); Xinge Yu, Chicago, IL (US); William Christopher Sheets, Chicago, IL (US); Wei Huang, Evanston, IL (US)

(73) Assignees: Northwestern University, Evanston, IL (US); Flexterra, Inc., Skokie, IL (US)

(*) Notice: Subject to any disclaimer, the term of this patent is extended or adjusted under 35 U.S.C. 154(b) by 166 days.

(21) Appl. No.: 15/012,770

(22) Filed: Feb. 1, 2016

(65) Prior Publication Data

US 2016/0268526 A1 Sep. 15, 2016

Related U.S. Application Data

(60) Provisional application No. 62/110,026, filed on Jan. 30, 2015.

(51) Int. Cl.
*H01L 51/05* (2006.01)
*H01L 51/00* (2006.01)

(52) U.S. Cl.
CPC ........ *H01L 51/055* (2013.01); *H01L 51/0558* (2013.01); *H01L 51/0097* (2013.01); *H01L 2251/303* (2013.01); *H01L 2251/306* (2013.01); *H01L 2251/308* (2013.01)

(58) Field of Classification Search
CPC ............... H01L 51/055; H01L 51/0558; H01L 51/0097
See application file for complete search history.

(56) References Cited

U.S. PATENT DOCUMENTS

| | | | |
|---|---|---|---|
| 7,723,430 B2 | 5/2010 | Kunitake et al. | |
| 2010/0147684 A1 | 6/2010 | Park et al. | |
| 2013/0019937 A1* | 1/2013 | So | H01L 51/442 136/256 |
| 2013/0056688 A1* | 3/2013 | Lin | B05D 5/12 252/514 |
| 2015/0242011 A1* | 8/2015 | Yeh | B32B 15/04 345/174 |
| 2016/0136853 A1* | 5/2016 | Dinunzio | C08L 23/06 523/102 |
| 2016/0187280 A1* | 6/2016 | Potyralio | G01N 27/228 324/675 |

OTHER PUBLICATIONS

Trung et al., A Flexible Reduced Graphene Oxide Field-Effect Transistor for Ultrasensitive Strain Sensing, Adv. Funct. Mater., 24, Jul. 22, 2013, pp. 117-124.

* cited by examiner

*Primary Examiner* — Joseph C Nicely
(74) *Attorney, Agent, or Firm* — Bell & Manning, LLC

(57) ABSTRACT

The present teachings relate to charge-transporting metal oxide-polymer blend thin films which can be incorporated as the semiconductor component or one of the conductor components of a thin film transistor. Generally, the present charge-transporting metal oxide-polymer blend thin film includes a semiconducting or conducting metal oxide lattice and an electrically insulating polymer dispersed within the lattice. The electrically insulating polymer is present at about 20% or less by weight of the metal oxide.

20 Claims, 16 Drawing Sheets

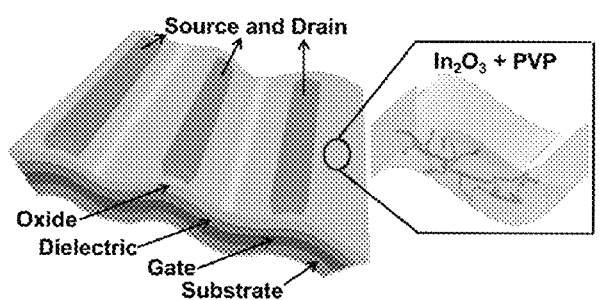
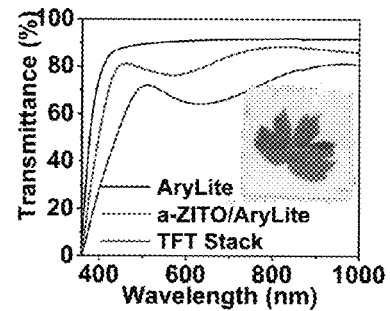
Figure 13            Figure 14
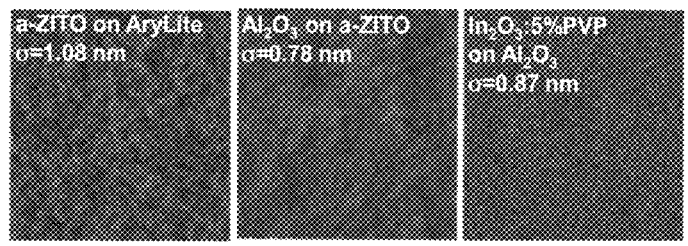
Figure 15
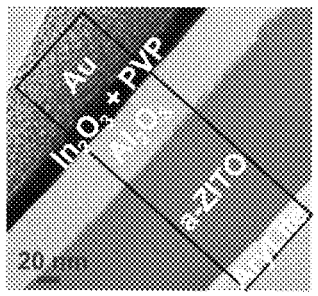
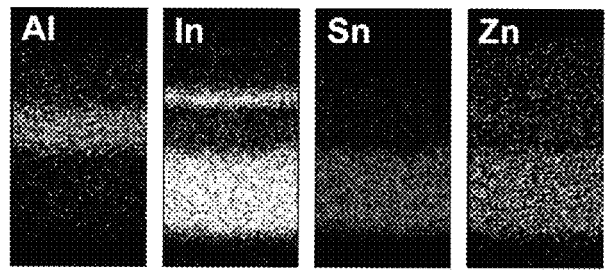
Figure 16            Figure 17
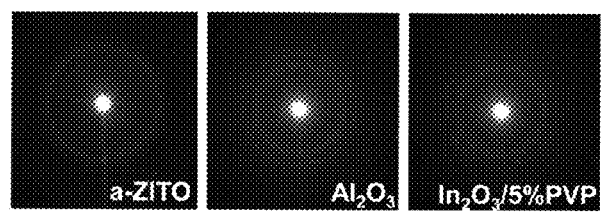
Figure 18

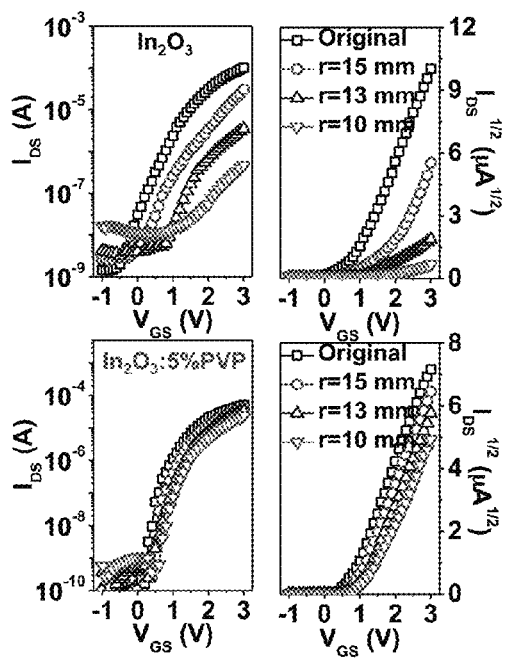
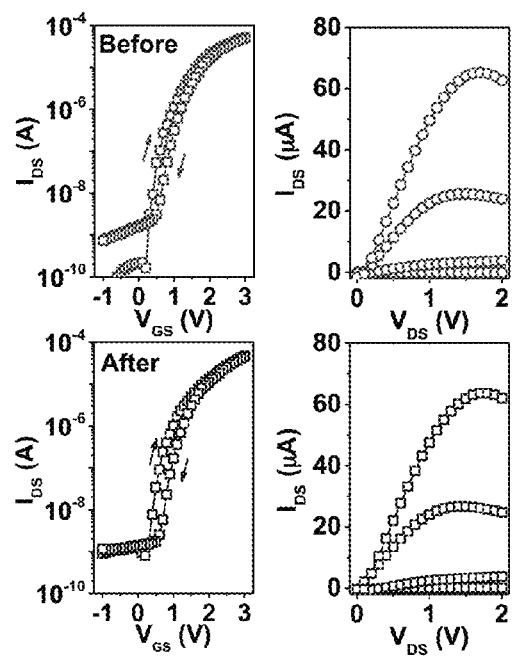
Figure 21
Figure 22
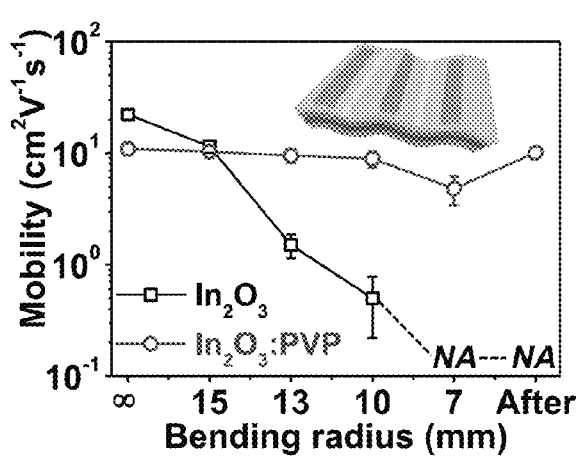
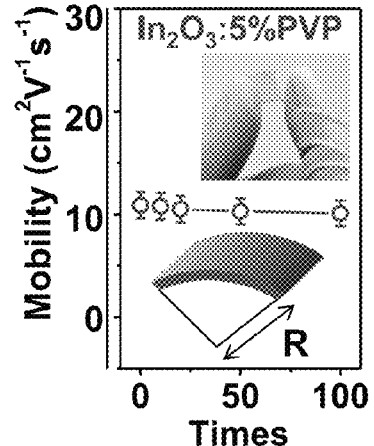
Figure 23
Figure 24

CHARGE-TRANSPORTING METAL OXIDE-POLYMER BLEND THIN FILMS

STATEMENT REGARDING FEDERALLY SPONSORED RESEARCH OR DEVELOPMENT

This invention was made with government support under grant number N00014-11-1-0690 awarded by the Office of Naval Research and grant number DMR-1121262 awarded by the National Science Foundation. The government has certain rights in the invention.

CROSS-REFERENCE TO RELATED APPLICATIONS

This application claims priority to and the benefit of U.S. Provisional Patent Application Ser. No. 62/110,026, filed on Jan. 30, 2015, the disclosure of which is incorporated by reference herein in its entirety.

BACKGROUND

Metal oxide (MO) semiconductors have attracted considerable attention for next-generation electronic devices because of their high carrier mobilities and good environmental stability. In addition, the high optical transparency of MO semiconductors could enable fully transparent thin-film transistors (TFTs), which are essential for the fabrication of "invisible" circuits and to increase the aperture ratio of active-matrix organic light-emitting diode (AMOLED) and liquid-crystal (LC) displays. Therefore, since the first report of a fully transparent MO-based TFT in 2003, extensive academic and industrial efforts have focused on enhancing device performance for both opaque and transparent applications. Nevertheless, the best-performing MO TFTs are typically fabricated by capital-intensive physical and chemical vapor deposition processes such as sputtering, and patterned using multi-step photolithographic processes. To enable inexpensive large-scale roll-to-roll production, it is necessary to develop solution-based process methodologies for the manufacturing of MO TFTs.

Another feature desired by next-generation electronic devices is mechanical flexibility. It is well known that polycrystalline films have limited mechanical flexibility, and mainly due to crack formation at grain boundaries, their electrical properties and structural integrity tend to deteriorate dramatically upon bending. Compared to polycrystalline MOs, amorphous MO semiconductors are more tolerant to mechanical stress, enabling their utilization and device fabrication on flexible substrates.

A well-known strategy to produce semiconducting amorphous MOs is to dope polycrystalline materials such as indium oxide ($In_2O_3$) with various X cations (e.g., $X=Ga^{3+}$, $Zn^{2+}$, $La^{3+}$, $Sc^{3+}$) to form ternary or quaternary amorphous alloys of formula IXO and IXZO composites (Z=zinc). An example of a technologically relevant amorphous IXZO material is indium-gallium-zinc-oxide (IGZO), which has excellent charge transport uniformity due to minimal structural defects. However, the carrier mobilities of these amorphous oxides are limited compared to that of the pristine $In_2O_3$ matrix. Efficient transport in $In_2O_3$ mainly originates from the diffuse In 5s orbitals at the bottom of the conduction band, leading to edge-sharing In—$O_6$ octahedra. In contrast, the oxygen vacancies regulating the carrier concentrations are difficult to control in $In_2O_3$, thus the resulting TFTs exhibit less than optimum current modulation ($I_{on}/I_{off}$) and poor threshold voltage ($V_T$) uniformity over large areas.

Furthermore, solution-processed amorphous IXO- and IXZO-based TFTs not only exhibit lower electron mobilities than $In_2O_3$, but also require relative higher processing temperatures (typically $\geq 300°$ C.) to facilitate metal-oxygen-metal (M-O-M) lattice formation, densification, and impurity removal. Such high processing temperatures are incompatible with inexpensive plastic substrates.

Similar limitations apply to conducting metal oxides where the best electrical conductivities are typically achieved for polycrystalline films such as tin-doped indium oxide (ITO). However, the electrical conductivity of ITO-coated plastic degrades severely upon multiple bending because of crack formation. Furthermore, although most of the MO dielectric materials are amorphous, the mechanical flexibility of these films tend to be limited because they are typically far thicker than the conducting and semiconducting layers used in the TFT stack.

Accordingly, there is a need in the art for semiconducting and conducting metal oxide films and electronic devices that can be processed at low temperatures, yet exhibiting charge transport characteristics that are comparable to polycrystalline MO semiconductor-based devices and yet having mechanical flexibility typical of those based on amorphous semiconducting films.

SUMMARY

In light of the foregoing, the present teachings provide metal oxide-polymer blend thin films that can be used as semiconductors, conductors, or dielectrics in various optical, electronic, and optoelectronic devices. Such metal oxide-polymer blend thin films generally include a metal oxide lattice and an electrically insulating polymer dispersed within the lattice. The incorporation of the polymer disrupts the crystallinity of the metal oxide lattice or creates stress release within the film. The resulting amorphous metal oxide-polymer blend thin film has highly enhanced mechanical flexibility. In embodiments where the metal oxide is a charge-transporting metal oxide (i.e., semiconducting or conducting metal oxide), by limiting the concentration of the polymer to about 20% or less by weight of the metal oxide, the metal oxide-polymer blend thin film surprisingly can retain or even improve upon the electronic properties (e.g., charge carrier mobility or conductivity) of the pristine MO thin film.

The present teachings also relate to devices including such metal-oxide polymer blend thin films and methods for fabricating such devices.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

FIG. 13 shows a schematic representation of a flexible, transparent polymer-doped MO TFT according to the present teachings (as embodied by the specific structure Arylite™/α-ZITO/AlO$_x$/In$_2$O$_3$:x % PVP/α-ZITO).

FIG. 14 shows the transmittance spectra of an AryLite™ film, an α-ZITO coated AryLite™ film, and a TFT array comprising a ZITO/AlO$_x$/In$_2$O$_3$:5% PVP/α-ZITO/AryLite stack. The inset is an optical image of the TFT array on top of a leaf.

FIG. 15 shows atomic force microscopy (AFM) images of a first film sample comprising α-ZITO film deposited on an AryLite™ substrate (left), a second film sample comprising AlO$_x$ deposited on top of an α-ZITO-coated AryLite™ substrate (middle), and a third film sample comprising an In$_2$O$_3$:5% PVP blend film on an AlO$_x$/α-ZITO/AryLite™ substrate (right), each having been annealed at 225° C.

FIG. 16 shows a cross-sectional TEM image of a flexible TFT device according to the present teachings with the structure AryLite™/α-ZITO/AlO$_x$/In$_2$O$_3$:5% PVP/Au (T$_a$=225° C.).

FIG. 17 shows energy-dispersive X-ray spectroscopy (EDS) scans of Al, In, Sn, and Zn of the same device area shown in FIG. 16 for Al, In, Sn, and Zn.

FIG. 18 shows representative energy-filtered nano-beam diffraction (EF-NBED) patterns of α-ZITO, AlO$_x$, and In$_2$O$_3$/5% PVP films. The resolution of the diffraction nano beam is 1 nm.

FIG. 21 compares the transfer plots of the present In$_2$O$_3$:5% PVP devices (bottom) versus control In$_2$O$_3$ devices (top) as both were bent at various radii (0 mm, 10 mm, 13 mm, and 15 mm) along a curvature parallel to the channel length.

FIG. 22 shows representative output and transfer plots of all-amorphous MO:polymer TFTs according to the present teachings before (top) and after (bottom) 100 bending cycles at a radius of 10 mm.

FIG. 23 shows the dependence of TFT mobilities against bending radius for all-amorphous In$_2$O$_3$:5% PVP TFTs according to the present teachings as compared to control devices (In$_2$O$_3$ TFTs).

FIG. 24 shows the dependence of TFT mobilities against the number of bending cycles (from 1 to 100 times) at a bending radius of 10 mm for all-amorphous In$_2$O$_3$:5% PVP TFTs according to the present teachings.

DETAILED DESCRIPTION

Figure 1:
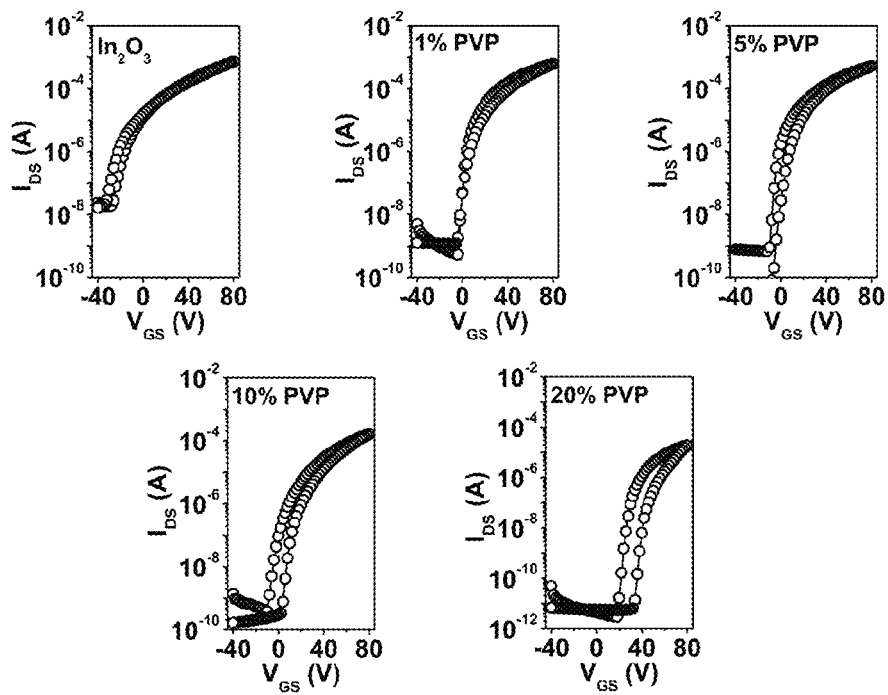
FIG. 1 compares the transfer plots of polymer-doped $In_2O_3$ thin film transistors (TFTs) processed at 225° C. on 300 nm $SiO_2$/Si substrates with various polymer (i.e., poly (4-vinylphenol), PVP) concentrations, specifically, at 0%, 1%, 5%, 10%, and 20%.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

The present teachings provide electronic, optical, and optoelectronic devices that include a metal oxide-polymer blend thin film semiconductor component and/or a metal oxide-polymer blend thin film conductor component. Such metal oxide-polymer blend component generally is composed of a metal oxide (MO) lattice and an electrically insulating polymer dispersed within the lattice. The inventors have found that the incorporation of a small amount of polymer into the MO lattice can disrupt its crystallinity, thereby providing an amorphous MO thin film. Surprisingly, by controlling the amount of polymer, the resulting amorphous polymer-doped MO thin film can retain or even improve upon the electronic properties (e.g., charge carrier mobility or conductivity) of the pristine MO thin film. Even more unexpectedly, the amorphous polymer-doped MO thin film has significantly improved mechanical flexibility. Most notably, their electronic properties can be largely preserved upon multiple bending and relaxing cycles, thereby enabling their use in flexible electronic devices.

As shown in the examples hereinbelow, the polymer used in the present MO-polymer blend thin film can be selected from various electrically insulating polymers known in the art. Suitable polymers according to the present teachings can include, without limitation, various dielectric polymers such as those having a low dielectric constant of between about 2 and about 10. Such polymers can have a molecular weight ranging from about 2,000 g/mol to about 1,000,000 g/mol. In most embodiments, the polymers typically include in the backbone —$CH_2$— groups (such as various vinyl polymers and polyalkylene oxides) or —$C(CH_3)_2$— groups (such as polycarbonates). Examples of suitable vinyl polymers include poly(4-vinyl phenol) (PVP), poly(vinyl alcohol) (PVA), poly(vinyl butyral) (PVB), polystyrene (PS), poly (meth)acrylates (e.g., poly(methyl methacrylate) (PMMA), and poly(2-hydroxyethyl methacrylate) (p-HEMA)), as well as their copolymers (including, without limitation, poly [styrene-co-(4-vinylphenol)], poly(4-vinylphenol-co-methyl methacrylate), and so forth). Suitable polyalkylene oxides include, without limitation, polyethylene glycol (PEG). In some embodiments, the polymer used in the present MO-polymer blend thin film can be an amine-rich polymer (i.e., a polymer having amine groups, especially, tertiary amine groups, in either its backbone and/or pendant groups). Such amine-rich polymers have electron-transfer ability, thus are capable of n-type doping. Examples of such amine-rich polymers include polyethyleneimine (PEI), poly(allylamine), and polyvinylamine. In particular embodiments, the present metal oxide thin film is doped with PEI, where such PEI can be in linear or branched form. Preferably, the polymers described herein can have good solubility in the solvent or solvent mixture used to dissolve the metal oxide precursor compounds (vide infra). For example, to have good solubility in common organic solvents and/or in water, the polymer can include functional groups such as oxy, hydroxyl, carboxylic, carbonate, amine, and phenolic groups.

The inventors have found that the present MO-polymer blend thin films can retain good charge-transporting properties when the polymer is present at about 20% by weight or less of the metal oxide. In preferred embodiments, the polymer can be present at about 10% by weight or less of the metal oxide, and more preferably, at about 5% by weight or less of the metal oxide.

Because of the presence of the polymer, crystallization of the metal oxide is frustrated, and the resulting metal oxide is in the amorphous state. In some embodiments, the present metal oxide-polymer blend thin film can include a semiconducting metal oxide selected from indium oxide ($In_2O_3$), indium zinc oxide (IZO), zinc tin oxide (ZTO), indium gallium oxide (IGO), indium-gallium-zinc oxide (IGZO), tin oxide ($SnO_2$), nickel oxide (NiO), copper oxide ($Cu_2O$), and zinc oxide (ZnO). In other embodiments, the present metal oxide-polymer blend thin film can include a conducting metal oxide selected from indium tin oxide (ITO, or tin-doped indium oxide Sn—In—O where the Sn content is about 10% or less), indium-doped zinc oxide (IZO), zinc indium tin oxide (ZITO), gallium-doped zinc oxide (GZO), gallium-doped indium oxide (GIO), fluorine-doped tin oxide ($SnO_2$:F), gallium indium tin oxide (GITO), cadmium oxide (CdO), and aluminum-doped zinc oxide (AZO). These semiconducting or conducting metal oxides can have dopants (such as fluorine, sulfur, lithium, rhodium, silver, cadmium, scandium, sodium, calcium, magnesium, barium, and lanthanum) to improve electron (for n-type) or hole (for p-type) mobility or conductivity.

The present metal oxide-polymer blend thin film can be prepared from a precursor composition that includes an electrically insulating polymer and one or more metal oxide precursor compounds that can react to form a metal oxide lattice at relatively low processing temperatures (e.g., at 350° C. or less). In other words, the metal oxide precursor compounds are selected such that the metal oxide formation process does not damage the polymer. While conventional sol-gel precursors such as metal alkoxides can be used, in preferred embodiments, the precursor composition includes a first metal oxide precursor compound and a second metal oxide precursor compound that can function, respectively, as an oxidizing agent and a fuel. This redox pair of precursors are chosen and provided under conditions to induce a combustion reaction. For example, the first metal oxide precursor compound can be a metal salt including an oxidizing anion selected from a nitrate, a perchlorate, a chlorate, a hypochlorite, an azide, a peroxide, a superoxide, a high-valent oxide, an N-oxide, a persulfate, a dinitramide, a nitrocyanamide, a nitroarylcarboxylate, a tetrazolate, and hydrates of the foregoing anions. The second metal oxide precursor compound can be a fuel compound selected from acetylacetone, glycine, $CF_3COCH_2COCF_3$, $CH_3COCHFCOCH_3$, $CH_3COCH_2C(=NH)CF_3$, $CH_3C(=NH)CHFC(=NH)CH_3$, $CH_3COCH_2C(=NCH_3)CF_3$, $CH_3C(=NCH_3)CHFC(=NCH_3)CH_3$, $CH_3C(=NH)CHFC(=NCH_3)CH_3$, $Ph_2POCH_2COCH_3$, urea, N-methylurea, citric acid, ascorbic acid, stearic acid, nitromethane, hydrazine, carbohydrazide, oxalyl dihydrazide, malonic acid dihydrazide, tetra formal tris azine, hexamethylenetetramine, and malonic anhydride. As further examples, the first metal oxide precursor compound can be a metal salt including a fuel anion selected from an acetylacetonate, a citrate, an oxalate, an ascorbate, and a stearate; and the second metal oxide precursor compound can be an oxidizing acid (e.g., $HNO_3$ or $NH_4NO_3$). When the metal oxide is a ternary or quaternary oxide, the precursor composition can include additional metal oxide precursor compounds, where such additional metal oxide precursor compounds can be a metal salt having an oxidizing anion, a fuel anion, or other anions such as halides (e.g., chlorides, bromides, iodides), carbonates, acetates, formates, propionates, sulfites, sulfates, hydroxides, alkoxides, trifluoroacetates, trifluoromethanesulfonates, tosylates, mesylates, and hydrates thereof. Suitable metal oxide precursor compounds are described in U.S. Pat. Nos. 8,940,578 and 8,940,579, the disclosures of which are incorporated by referenced herein for all purposes.

The concentration of the various metal salts in the precursor composition can be between about 0.01 M and about 5.0 M. For example, the metal salts in combination can have a concentration between about 0.02 M and about 2.0 M, between about 0.05 M and about 1.0 M, between about 0.05 M and about 0.5 M, or between about 0.05 M and about 0.25 M. The polymer typically is present at 20% by weight or less of the metal oxide precursor compounds. In preferred embodiments, the polymer can be present at about 10% by weight or less of the metal oxide precursor compounds, and more preferably, at about 5% by weight or less of the metal oxide precursor compounds.

The polymer and the various metal oxide precursor compounds can be dissolved in a solvent or solvent mixture. The solvent or solvent mixture can include water and/or one or more organic solvents. For example, the solvent can be selected from water, an alcohol, an aminoalcohol, a carboxylic acid, a glycol, a glycol ether, an ether acetate, a hydroxyester, an aminoester, and a mixture thereof. In some embodiments, the solvent can be selected from water, methanol, ethanol, n-propanol, isopropanol, butanol, pentanol, hexyl alcohol, heptyl alcohol, ethyleneglycol, methoxyethanol, ethoxyethanol, methoxypropanol, ethoxypropanol, methoxybutanol, dimethoxyglycol, N,N-dimethylformamide, propylene glycol methyl ether acetate, propylene glycol monomethyl ether, methyl acetate, ethyl acetate, butyl acetate, ethyl-3-ethoxypropionate, and mixtures thereof. In particular embodiments, the solvent can be an alkoxyalcohol such as methoxyethanol, ethoxyethanol, methoxypropanol, ethoxypropanol, or methoxybutanol.

In some embodiments, the precursor composition can include a metal oxide nanomaterial together with or instead of the foregoing metal oxide precursor compounds. In embodiments where the precursor compounds include both metal oxide nanomaterials and metal oxide precursor compounds, the redox pair of combustion precursors can function as a binder component for the metal oxide nanomaterial, enabling lower processing temperature for forming the metal oxide-polymer blend thin film compared to embodiments where only metal oxide nanomaterials are used. As used herein, a "nanomaterial" generally has at least one dimension of about 300 nm or smaller. Examples of nanomaterials include nanoparticles (which can have irregular or regular geometries), nanospheres, nanowires (which are characterized by a large aspect ratio), nanoribbons (which has a flat ribbon-like geometry and a large aspect ratio), nanorods (which typically have smaller aspect ratios than nanowires), nanotubes, and nanosheets (which has a flat ribbon-like geometry and a small aspect ratio). Various metal oxide nanomaterials are commercially available or can be prepared by one skilled in the art.

In various embodiments, the present precursor composition can include a base, typically, $NH_3$. In various embodiments, the base can be introduced into the precursor composition after the various metal oxide precursor compounds have dissolved completely in the solvent or solvent mixture, but before the addition of the polymer. In various embodiments, the precursor composition can include one or more additives selected from detergents, dispersants, binding agents, compatibilizing agents, curing agents, initiators, humectants, antifoaming agents, wetting agents, pH modifiers, biocides, and bacteriostats. For example, surfactants, chelates (e.g., ethylenediaminetetraacetic acid (EDTA)), and/or other polymers (e.g., polystyrene, polyethylene, poly-alpha-methylstyrene, polyisobutene, polypropylene, polymethylmethacrylate and the like) can be included as a dispersant, a binding agent, a compatibilizing agent, and/or an antifoaming agent.

As shown in the examples hereinbelow, by incorporating a polymer into the metal oxide lattice, the metal oxide thin film gains significantly improved mechanical flexibility. Meanwhile, by limiting the polymer concentration to less than or about 20% by weight of the metal oxide content, the electronic properties of the semiconducting or conducting metal oxide can be largely preserved. Accordingly, an aspect of the present teachings is directed to a method of fabricating a metal oxide thin film transistor, where the transistor includes a metal oxide-polymer blend thin film semiconductor and/or a metal oxide-polymer blend thin film conductor. The thin film transistor can have different configurations, for example, a top-gate top-contact structure, top-gate bottom-contact structure, a bottom-gate top-contact structure, or a bottom-gate bottom-contact structure. A thin film transistor generally includes a substrate, electrical conductors (source, drain, and gate conductors), a dielectric component coupled to the gate conductor, and a semiconductor component coupled to the dielectric on one side and in contact with the source and drain conductors on the other side. As used herein, "coupled" can mean the simple physical adherence of two materials without forming any chemical bonds (e.g., by adsorption), as well as the formation of chemical bonds (e.g., ionic or covalent bonds) between two or more components and/or chemical moieties, atoms, or molecules thereof.

The present methods of fabricating a metal oxide thin film transistor can include forming a metal oxide-polymer blend thin film, wherein the metal oxide-polymer blend thin film is prepared by depositing a thin film from a precursor composition including a first metal oxide precursor compound, a second metal oxide precursor compound, and an electrically insulating polymer in a solvent or solvent mixture, wherein the first and second metal oxide precursor compounds include an oxidizing agent and a fuel; and annealing the thin film to convert the first and second metal oxide precursor compounds into a metal oxide lattice.

Various solution processing techniques known in the art can be used to deposit the metal oxide-polymer blend thin film. For example, the depositing step can be carried out by spin-coating, spray-coating, slot-coating, drop-casting, zone casting, dip coating, blade coating, rod coating, or stamping. In other embodiments, the depositing step can be carried out by printing, including inkjet printing and various contact printing techniques (e.g., screen-printing, gravure printing, offset printing, pad printing, lithographic printing, flexographic printing, and microcontact printing). To ensure good film quality and compatibility with different solution processing techniques, it is important that the precursor composition has tunable viscosities. In this regard, the addition of electrically insulating polymers to the metal oxide precursor composition also provides a means to adapt the precursor composition to the viscosity ranges appropriate for a particular solution process. Specifically, for metal oxide precursor compositions without any polymers, the viscosity of the formulation entirely depends on the solvent viscosity given the metal salt content typically is at a very low concentration. By adding the present electrically insulating polymer, the viscosity of the formulation can be increased by, for example, using polymers with chains that are more likely to entangle, increasing the polymer concentration, and/or using polymers that have a higher molecular weight. For instance, more rigid polymers such as crystalline and high $T_g$ polyolefins can provide a higher viscosity compared to more amorphous and low $T_g$ acrylate polymers. In embodiments where the polymer is PVP, the viscosity of the precursor composition can be increased by increasing the polymer molecular weight, such as, from 25,000 to 300,000 g/mol.

As described above, using metal oxide precursor compounds that are adapted to undergo combustion reaction can allow the annealing temperature to be less than or about 350° C. In various embodiments, the annealing temperature can be less than or about 325° C., less than or about 300° C., less than or about 275° C., less than or about 250° C., less than or about 225° C., less than or about 200° C., less than or about 180° C., or as low as about 150° C.

In some embodiments, the depositing step and the annealing step can be performed sequentially, and the depositing-annealing cycle can be repeated multiple times to provide the desired film thickness.

In other embodiments, the depositing step and the annealing step can be performed simultaneously, for example, by spray-coating. Unlike conventional methods such as spin-coating which often require multiple cycles of deposition and post annealing steps to avoid gas buildup and undesirable microstructural features in the oxide thin films if a certain thickness is desired (e.g., >10 nm), spray-coating can achieve a film thickness greater than about 40 nm in a fraction of an hour without sacrificing film quality (compared to conventional multi-hour processes). Specifically, because film growth and annealing take place simultaneously, gas accumulation in the film is more suppressed, and the resulting film has smoother surfaces and smaller pore size when compared to spin-coated films of the same thickness, which can lead to better electronic properties.

To further illustrate, in embodiments where the metal oxide thin film transistor has a bottom gate structure, a metal oxide-polymer blend thin film semiconductor is formed on the gate dielectric. The gate dielectric can be composed of inorganic (e.g., oxides such as $SiO_2$, $Al_2O_3$, or $HfO_2$; and nitrides such as $Si_3N_4$), organic (e.g., polymers such as polycarbonate, polyester, polystyrene, polyhaloethylene, polyacrylate), or hybrid organic/inorganic materials. In certain embodiments, the gate dielectric can be a metal oxide-polymer blend thin film prepared according to the present methods. Specifically, the gate dielectric can include an electrically insulating metal oxide and an electrically insulating polymer prepared from a precursor composition including a dielectric metal oxide nanomaterial and/or dielectric metal oxide precursor compounds and an electrically insulating polymer. Exemplary insulating metal oxides include alumina ($Al_2O_3$), cerium oxide ($CeO_x$), yttrium oxide ($Y_2O_3$), titanium oxide ($TiO_2$), zirconium oxide ($ZrO_2$), hafnium oxide ($HfO_2$), tantalum oxide ($Ta_2O_5$), and barium and strontium titanium oxide (($Ba,Sr)TiO_3$). The implementation of metal oxide thin film dielectric (whether comprising a pristine metal oxide or a metal oxide-polymer blend) with a metal oxide-polymer blend thin film semiconductor according to the present teachings can lead to much improved mechanical stress tolerance and semiconductor-dielectric interface, which can enhance the transistor performance significantly.

The gate electrode and the other electrical contacts (source and drain electrodes) independently can be composed of metals (e.g., Au, Ag, Al, Ni, Cu), transparent conducting oxides (e.g., ITO, FTO, IZO, ZITO, GZO, GIO, or GITO), or conducting polymers (e.g., poly(3,4-ethylenedioxythiophene) poly(styrenesulfonate) (PEDOT:PSS), polyaniline (PANI), or polypyrrole (PPy)). In certain embodiments, the gate electrode (and/or source and drain electrodes) of the thin film transistor can be a metal oxide-polymer blend thin film conductor according to the present teachings. For example, the metal oxide thin film transistor can include a metal oxide-polymer blend thin film conductor as the gate electrode, where the metal oxide-polymer blend thin film conductor is composed of a metal oxide lattice and an electrically insulating polymer dispersed therewithin and present at no more than about 20% by weight of the metal oxide.

The substrate component can be selected from doped silicon, glass, aluminum or other metals alone or coated on a polymer or other substrate, a doped polythiophene, as well as polyimide or other plastics including various flexible plastics. In preferred embodiments, the substrate is a flexible plastic substrate with high transparency. Examples of such flexible substrates include polyesters such as polyethylene terephthalate, polyethylene naphthalate, polycarbonate; polyolefins such as polypropylene, polyvinyl chloride, and polystyrene; polyphenylene sulfides such as polyphenylene sulfide; polyamides; aromatic polyamides; polyether ketones; polyimides; acrylic resins; polymethylmethacrylate, and blends and/or copolymers thereof.

In one aspect, the present teachings relate to flexible metal oxide thin film transistors. Such flexible metal oxide thin film transistors can include a metal oxide-polymer blend thin film semiconductor component, wherein the metal oxide-polymer blend thin film semiconductor component includes an amorphous semiconducting metal oxide and an electrically insulating polymer, and wherein the flexible metal oxide thin film transistor is characterized by a charge carrier mobility of at least about 0.04 cm$^2$/Vs and is capable of retaining at least 50% of said charge carrier mobility after 100 cycles of bending and relaxing. The bending can involve bending the flexible metal oxide thin film transistor to a radius ranging from about 5 mm to about 15 mm. Particularly, the amorphous semiconducting metal oxide can be selected from α-In$_2$O$_3$, α-IZO, α-ZTO, α-IGO, α-IGZO, α-SnO$_2$, α-NiO, α-Cu$_2$O, and α-ZnO, and the electrically insulating polymer can be selected from polyethyleneimine (PEI), poly(allylamine), polyvinylamine, poly(4-vinyl phenol) (PVP), poly(vinyl alcohol) (PVA), poly(vinyl butyral) (PVB), polystyrene (PS), poly(methyl methacrylate) (PMMA), and poly(2-hydroxyethyl methacrylate) (p-HEMA), and copolymers thereof. The flexible metal oxide thin film transistors also can include a dielectric component which is an amorphous metal oxide (e.g., Al$_2$O$_3$) optionally doped with an electrically insulating polymer. The flexible metal oxide thin film transistors can further include one or more conductor components (e.g., gate and/or source and drain electrodes) that are composed of an amorphous metal oxide (e.g., ZITO) optionally doped with an electrically insulating polymer. The flexible metal oxide thin film transistors can include a flexible plastic substrate. The entire device can be transparent; for example, characterized by an optical transmittance of about 70% or greater in the visible range.

Polymer-doped metal oxide thin film transistors according to the present teachings can be used to enable flat panel display and flexible display backplane technologies, with arrays of the TFTs acting as either drivers and/or switches. In addition, the metal oxide-polymer blend thin films according to the present teachings can be used in optical, electronic, and optoelectronic devices other than thin film transistors. For example, the present metal oxide-polymer blend thin films can be used as transparent conducting metal oxides in light-emitting devices; and as electrodes or interfacial layers (e.g., hole-transport layer (HTL) or electron-transport layer (ETL)) in bulk-heterojunction (BHJ-OPV) or dye-sensitized (DSSC)) photovoltaic devices.

In addition to thin film transistors and thin film photovoltaic devices, the present metal oxide-polymer blend thin films can be embodied within devices such as sensors, capacitors, flexible circuits, ring oscillators, and the like.

While the above description specifically refers to metal oxide-polymer blend thin films, the present teachings can be applied analogously to semiconducting or conducting metal chalcogenides such as various metal sulfides, selenides, and tellurides.

The following examples are provided to illustrate further and to facilitate the understanding of the present teachings and are not in any way intended to limit the invention.

Example 1

Polymer-Doped MO Thin Film Transistors on SiO$_2$/Si Substrates

In this preliminary study to investigate how polymer content affects charge transport in polymer-doped metal oxide (MO) thin film transistors (TFTs), bottom-gate top-contact TFTs were fabricated on rigid silicon substrates as follows.

Doped silicon with a 300 nm thermal SiO$_2$ layer (p+ Si/300 nm SiO$_2$ wafers, WRS Materials; solvent cleaned and then treated with an oxygen plasma for 5 minutes) were used as the gate electrode and dielectric layer, respectively. The channel layer, consisting of a poly(4-vinylphenol) (PVP)-doped (x % by weight) In$_2$O$_3$ thin film blend, was deposited by spin-coating (at 3500 rpm for 30 seconds) an In$_2$O$_3$ precursor/PVP blend solution [In$_2$O$_3$ precursor: x % PVP; x=1-20% by weight] onto the 300 nm SiO$_2$/Si substrates, followed by annealing on a hot plate at processing temperatures (T$_a$) of either about 225° C. or about 250° C. for 30 minutes. This process was repeated 4 times to achieve the desired thickness (about 18 nm for pristine In$_2$O$_3$ films, and about 18 to 23 nm for MO:polymer blended films depending on the contents of PVP). The devices were completed with thermally evaporated 40 nm Al as source and drain electrodes (channel length L=50 μm, width W=1000 μm, respectively).

The In$_2$O$_3$ precursor/PVP blend solution was prepared as follows. First, an In$_2$O$_3$ precursor solution was prepared by dissolving indium(III) nitrate hydrate, In(NO$_3$)$_3$.xH$_2$O, (177.4 mg) in 2-methoxyethanol (10 ml), followed by addition of NH$_4$OH (55 μL) and acetylacetone (100 μL) and stirring overnight. Separately, a polymer solution was prepared by dissolving 100 mg of PVP (M$_W$25000) in 2-methoxyethanol and stirring overnight to provide a 10 mg/ml PVP solution. To prepare the In$_2$O$_3$ precursor/PVP blend (MO:polymer) solution, different amounts of the PVP solution was added into the In$_2$O$_3$ precursor solution to achieve a PVP weight fraction content (x %) from 1% to 20%. After addition, the MO:polymer solutions were stirred for 4 h before spin-coating.

TFT characterization was performed under ambient conditions on a custom probe station using an Agilent 1500 semiconductor parameter analyzer. The charge carrier mobility μ was evaluated in the saturation region with the conventional MOSFET model by equation (1):

$$I_{DS}=(WC_i/2L)\mu(V_{GS}-V_T)^2 \quad (1)$$

where C$_i$ is the capacitance per unit area of insulator, V$_T$ is the threshold voltage, and V$_{GS}$ is gate voltage. W and L are channel width and length, respectively.

Figure 2:
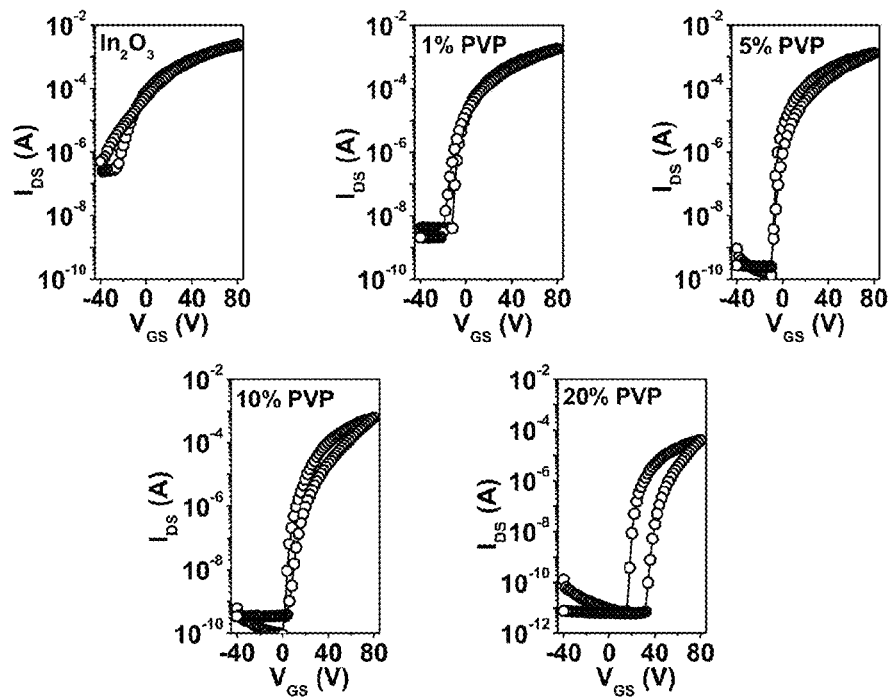
FIG. 2 compares the transfer plots of polymer-doped $In_2O_3$ thin film transistors (TFTs) processed at 250° C. on 300 nm SiO$_2$/Si substrates with various polymer (i.e., poly (4-vinylphenol), PVP) concentrations, specifically, at 0%, 1%, 5%, 10%, and 20%.
Figure 3:
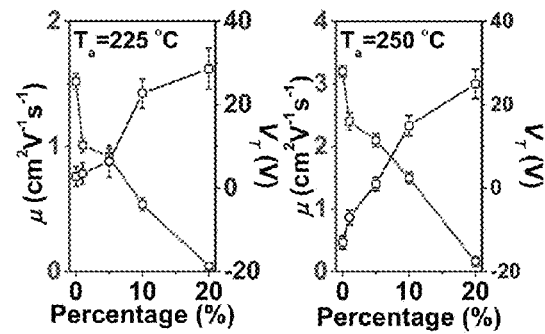
FIG. 3 compares the carrier mobility (μ, square) and threshold voltage (V$_T$, circle) for polymer-doped In$_2$O$_3$ TFTs having different PVP concentrations (0-20%), processed at 225° C. and 250° C., respectively.
Figure 4:
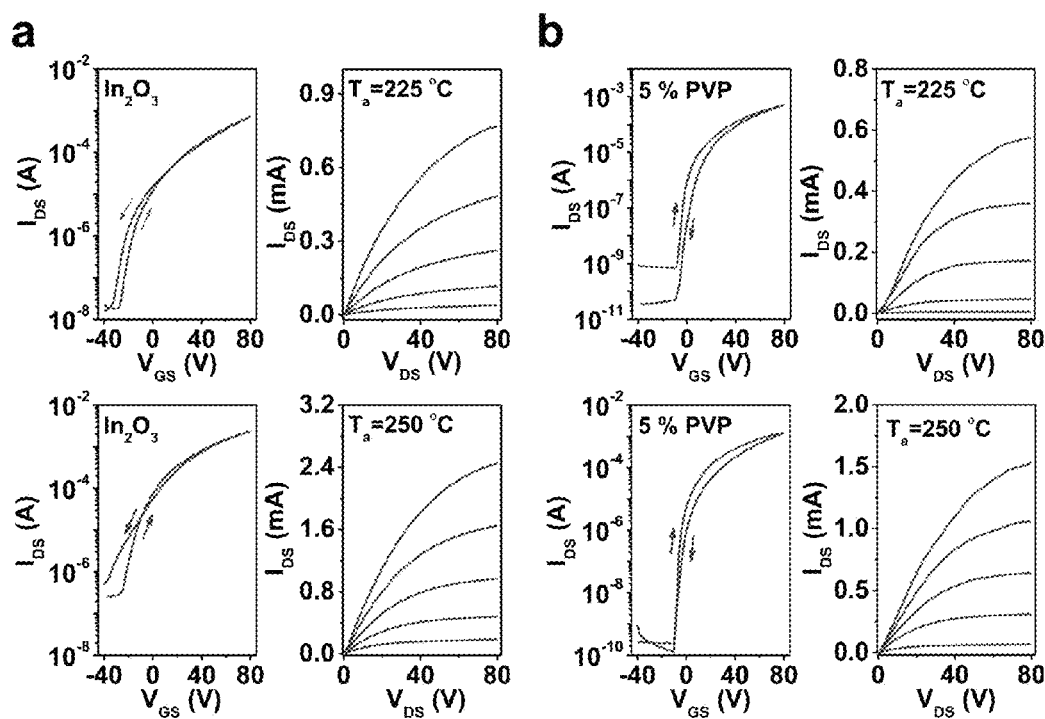
FIG. 4 contrasts representative transfer and output characteristics of (a) pristine In$_2$O$_3$ TFTs versus (b) polymer-doped In$_2$O$_3$ TFTs with 5% PVP. All devices were fabricated on 300 nm SiO$_2$/Si substrates and were processed at either 225° C. or 250° C.

Representative transfer I$_{DS}$-V$_{GS}$ characteristics for selected devices processed at 225° C. and 250° C. are shown in FIGS. 1 and 2, respectively. FIG. 3 compares the carrier mobility (μ, square) and threshold voltage (V$_T$, circle) for polymer-doped In$_2$O$_3$ TFTs having different PVP concentrations, processed at 225° C. and 250° C., respectively. FIG. 4 contrasts representative transfer I$_{DS}$-V$_{GS}$ and output I$_{DS}$-V$_{DS}$ characteristics of (a) pristine In$_2$O$_3$ TFTs versus (b) polymer-doped In$_2$O$_3$ TFTs with 5% PVP. Table 1 below summarizes the key TFT performance parameters.

TABLE 1

Performance metrics[a] for MO:PVP TFTs with different concentrations of PVP.

| $T_a$ (° C.) | TFT Performance | PVP Doping (%) | | | | |
|---|---|---|---|---|---|---|
| | | 0 | 1 | 5 | 10 | 20 |
| 225 | $\mu$ (cm$^2$V$^{-1}$s$^{-1}$) | 1.52 ± 0.06 | 1.01 ± 0.06 | 0.92 ± 0.07 | 0.54 ± 0.05 | 0.04 ± 0.02 |
| | $V_T$ (V) | 2.8 ± 2.4 | 3.5 ± 2.6 | 6.4 ± 3.8 | 22.7 ± 3.5 | 28.6 ± 4.9 |
| | $I_{on}/I_{off}$ | $10^4$-$10^5$ | $10^5$-$10^6$ | $10^5$-$10^6$ | $10^5$-$10^6$ | $10^5$-$10^6$ |
| 250 | $\mu$ (cm$^2$V$^{-1}$s$^{-1}$) | 3.20 ± 0.10 | 2.43 ± 0.14 | 2.12 ± 0.11 | 1.49 ± 0.09 | 0.16 ± 0.08 |
| | $V_T$ (V) | −12.9 ± 1.6 | −6.8 ± 1.8 | 1.2 ± 1.7 | 14.5 ± 2.4 | 25.1 ± 3.5 |
| | $I_{on}/I_{off}$ | $10^3$-$10^4$ | $10^5$-$10^6$ | $10^6$-$10^7$ | $10^4$-$10^5$ | $10^5$-$10^6$ |

[a]Each device metric is the average of a minimum of 15 devices.

Typical n-channel TFT behavior was observed for $V_{GS}$=80 V and $V_{DS}$=80 V operation with all the tested devices. Referring to Table 1, pristine In$_2$O$_3$ TFTs exhibit the highest mobility ($\mu$), with $\mu$~1.52 cm$^2$/Vs at $T_a$=225° C. and $\mu$~3.20 cm$^2$/Vs at $T_a$=250° C. Note, however, that the threshold voltage ($V_T$) shifted negatively and the off-currents were quite high (in the range of 10$^{-8}$ A to 10$^{-6}$ A). This is likely due to the high carrier concentrations arising from the Fermi level proximity to the conduction band minimum (CBM), and thus, it is difficult to deplete the carriers in these polycrystalline In$_2$O$_3$ films.

For the polymer-doped devices, it can be seen from FIG. 3 that as the PVP concentration increased from 1% to 20%, charge carrier mobility decreased (square plot), while $V_T$ shifted to the positive direction (circle plot), and the off-current dropped. More specifically, for the In$_2$O$_3$:1% PVP devices and the In$_2$O$_3$:5% PVP devices, the mobilities were quite high (In$_2$O$_3$:1% PVP devices: $\mu$=1.01 cm$^2$/Vs, $V_T$=3.5 V, $I_{off}$=10$^{-9}$ A for $T_a$=225° C.; $\mu$=2.43 cm$^2$/Vs, $V_T$=−6.8 V, $I_{off}$=10$^{-9}$ A for $T_a$=250° C.; In$_2$O$_3$:5% PVP devices: $\mu$=0.92 cm$^2$/Vs, $V_T$=6.4 V, $I_{off}$=10$^{-9}$-10$^{49}$ A for $T_a$=225° C.; $\mu$=2.12 cm$^2$/Vs, $V_T$=1.2 V, $I_{off}$=10$^{-9}$-10$^{10}$ A for $T_a$=250° C.). Without wishing to be bound by any particular theory, the $V_T$ and $I_{off}$ enhancements and slight decrease in p values may be ascribed to carrier concentration modulation from PVP-induced electron traps.

By comparison, further increase of the PVP concentration to 10% significantly lowered the electron mobility to 0.54 cm$^2$/Vs at 225° C. and 1.49 cm$^2$/Vs at 250° C. for the In$_2$O$_3$:10% PVP devices, then another order of magnitude lower for the In$_2$O$_3$:20% PVP devices ($\mu$=0.04 cm$^2$/Vs at 225° C. and $\mu$=0.16 cm$^2$/Vs at 250° C.). Without wishing to be bound by any particular theory, these results may be attributed to the formation of large densities of electron traps arising from the large quantities of residual OH groups as well as the disruption of conductive pathways (which is supported by EXAFS data, infra).

Example 2

Characterization of Polymer-Doped MO Semiconducting Films

To investigate how the incorporation of polymer affects the microstructure of MO semiconducting films, grazing incidence X-ray diffraction (GIXRD) experiments were carried out for different In$_2$O$_3$:x % PVP blend films using a Rigaku ATX-G Thin Film Diffraction Workstation using Cu kα radiation coupled to a multilayer mirror. Representative GIXRD plots for these polymer/MO blend films annealed at 225° C. and 250° C. are shown in FIG. 5.

Figure 5:
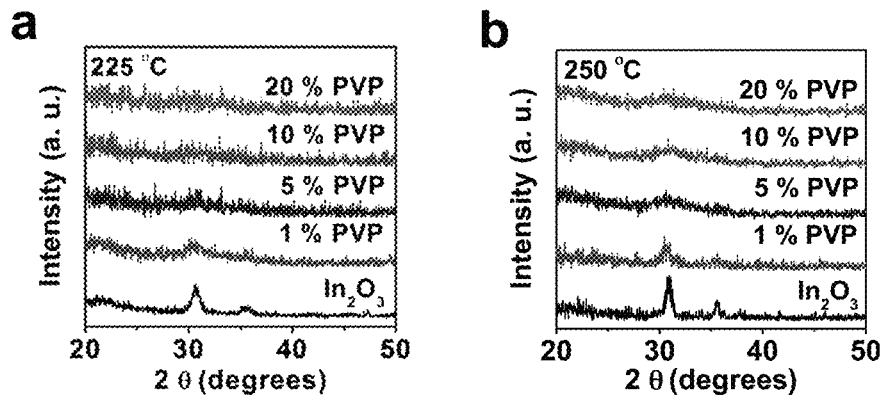
FIG. 5 shows representative grazing incidence X-Ray diffraction (GIXRD) plots for polymer (PVP)/metal oxide (In$_2$O$_3$) blend films with different polymer concentration (% PVP=0, 1, 5, 10 and 20) annealed at (a) 225° C. and (b) 250° C., respectively.

Referring to FIG. 5, it can be seen that the pristine In$_2$O$_3$ films are crystalline even when annealed at a temperature as low as 225° C. The low-temperature processing was enabled by the use of redox precursors specifically intended to react in a combustion reaction (specifically, a metal nitrate salt as the oxidant and acetylacetone as the fuel). When the annealing temperature was increased to 250° C., sharper and stronger Bragg reflections were observed, indicating enhanced film crystallinity. Noticeably, the polycrystalline In$_2$O$_3$ films became amorphous when PVP was incorporated to form a blend. Specifically, when the processing temperature is 225° C., it can be seen that incorporating as little as 1% by weight of PVP appears to frustrate crystallization. At a higher annealing temperature (250° C.), the polymer concentration needs to be increased accordingly (e.g., to 5% by weight or more) to provide an amorphous microstructure.

Next, X-ray absorption fine structure (XAFS) measurements were performed to study the effects of PVP doping on amorphous In$_2$O$_3$:x % PVP film microstructures. XAFS is a powerful tool to probe the local environments around atoms of interest and has been widely used to establish structure-properties correlations for amorphous oxides semiconductors.

XAFS and extended X-ray absorption fine structure (EXAFS) experiments were conducted at sector 5BMD at DuPont-Northwestern-Dow Collaboration Assess Team (DND-CAT) at Advanced Photon Source (APS) of Argonne National Laboratory (ANL). A Si (111) double crystal monochromator was used to produce an 8 mm (horizontal) by 0.6 mm (vertical) beam. The incident beam energies were tuned to near the In K edge (27940 eV) to measure XAFS spectra. All films were measured by using the grazing incidence EXAFS mode. Two four-element silicon drift detector (SII NanoTechnology) was used to collect the fluorescence signals. The reference powders were uniformly spread on Scotch tape (3M Corp.) and measured through transmission mode by using ionization chamber (Oxford Danfysik). XAFS spectra were extracted and normalized by using ATHENA software packages. The intrinsic loss factors were obtained by modeling of the reference powders for each absorbing atom, and were fixed when fitting the films data. The bond distances, coordination numbers, Debye-Waller factors were obtained by the FEFF simulations using a cluster of the bixbyite structure with a radius of 6 Å centered on the absorbing atom (In). All the normalized absorption coefficient χ(k) were Fourier transformed using a Hanning window over the specified k-range and fit in R-space with k-weight 3.

Using data obtained from the EXAFS measurements, information such as coordination number (CN), bond length, and Debye-Waller factor could be obtained from equation 2, $$\chi(k) = \sum_i \frac{N_i(\theta)|f_i(k)|S_0^2}{kR_i^2} \sin[2R_i k + \phi_i(k)] e^{\frac{-2R_j}{\lambda(k)}} e^{-2\sigma_i^2 k^2} \quad (2)$$

where $\chi(k)$ is the normalized absorption coefficient; $S_0^2$ is the intrinsic loss factor;

$$e^{\frac{-2R_j}{\lambda(k)}}$$

is the attenuation factor related to the electron mean free path $\lambda(k)$; $N_i$ and $R_i$ are the CN and bond distance of the ith shell of the absorbing atom, respectively; $f_i(k)$ and $\varphi_i(k)$ are the backscattering amplitude and the phase shift; $e^{-2\sigma_i^2 k^2}$ is the Debye-Waller factor. The Fourier transform of $\chi(k)$ can generate the pseudo-radial distribution function (p-RDF) around the central atoms.

Figure 6:
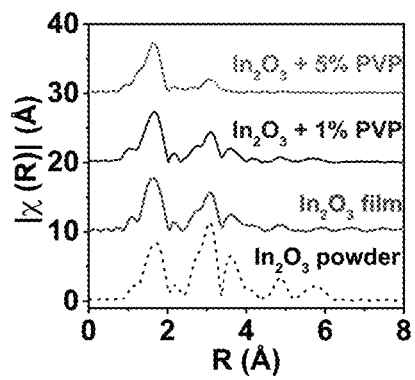
FIG. 6 compares the pseudo-radial distribution function (p-RDF) at the indium K edge for In$_2$O$_3$ powder, pristine In$_2$O$_3$ film, In$_2$O$_3$:PVP films with 1% PVP, and In$_2$O$_3$:PVP films with 5% PVP, using data obtained from extended X-ray absorption fine structure (EXAFS) measurements.
Figure 7:
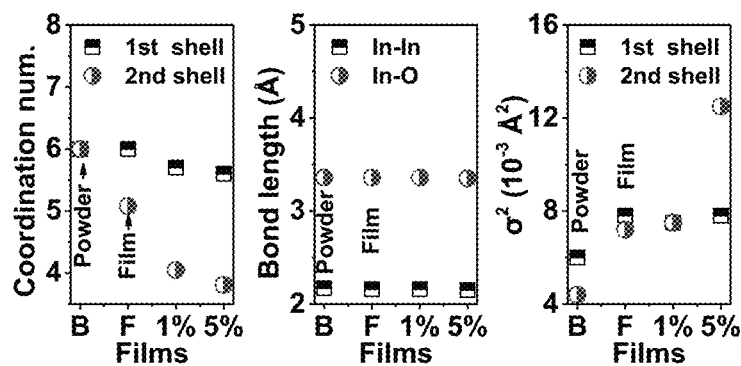
FIG. 7 shows the coordination numbers, In—In and In—O bond lengths, and G$^2$ values derived from EXAFS data for the indicated samples (B=In$_2$O$_3$ powder, F=pristine In$_2$O$_3$ film, 1%=In$_2$O$_3$:PVP films with 1% PVP, and 5%=In$_2$O$_3$:PVP films with 5% PVP).

Specifically, pristine $In_2O_3$ (F), $In_2O_3$:1% PVP (1%), and $In_2O_3$:5% PVP (5%) films processed at 250° C. were analyzed by EXAFS at the indium K edge. FIGS. 6 and 7 compare the p-RDFs and fitting results from these films along with those from an $In_2O_3$ reference powder (from Aldrich) (B) with a two-shell model and fitting range of k=3~11 Å$^{-1}$. The first shell CNs of the In—O $In_2O_3$:polymer films are 5.7 for $In_2O_3$:1% PVP and 5.6 for $In_2O_3$:5% PVP, showing slight under-coordination versus CN=6 for $In_2O_3$ powder and film samples. For the second shell, CN decreases more significantly, from 6 in the $In_2O_3$ powder and 5.08 in the pristine $In_2O_3$ film to 4.05 in $In_2O_3$:1% PVP, and 3.81 in $In_2O_3$:5% PVP. The reduced CN for the first and second shells and the increased Debye-Waller factor in the $In_2O_3$:polymer blends agree with the XRD data above that crystallization is frustrated by PVP addition. It is known that in metal ion-doped $In_2O_3$ films, the introduction of secondary metal ions such as Zn and Ga also increases local disorder and suppresses film crystallinity. This is evident in the p-RDF data showing that the In—O polyhedra remain relatively intact (in the 1$^{st}$ shell, the CN~6) but the In-M coordination is significantly reduced, while from the XAFS results (CN~6 in the 1$^{st}$ shell and reduction of 2$^{nd}$ shell, higher Debye-Waller factor of 2$^{nd}$ shell), it appears that a similar mechanism operates in all the $In_2O_3$:x % PVP blends, where the polymer chains disrupt oxide lattice formation at the nanoscale grain level rather than at the atomic level. Accordingly, these data substantiate that appropriate polymer incorporation can promote the amorphous state of MO semiconducting films but also can allow a sufficient density of connected M-O polyhedra for efficient charge transport.

X-ray photoelectron spectroscopy (XPS) was next utilized to better understand the chemical/structural and local bonding differences between the various $In_2O_3$-based films. XPS measurements (In 3d, and O 1s signals) were monitored with an Omicron ESCA Probe (Omicron Nanotechnology, Taunusstein, Germany) on $In_2O_3$:x % PVP/$SiO_2$ film samples after surface cleaning.

Figure 8:
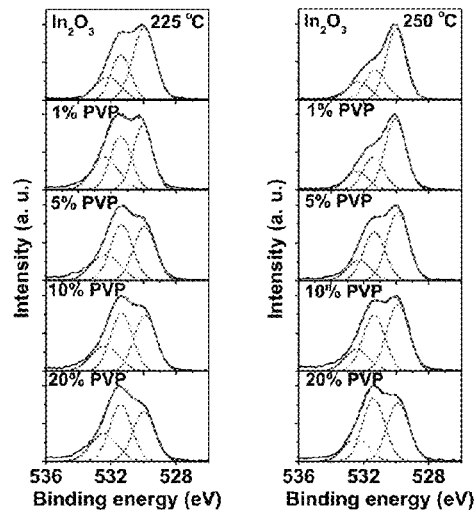
FIG. 8 shows X-ray photoelectron spectroscopy (XPS) O 1s spectra of In$_2$O$_3$:polymer films deposited with various PVP concentrations and annealed at 225° C. (left) and 250° C. (right), respectively.

FIG. 8 shows the O1s spectra for $In_2O_3$ for various PVP compositions, ranging from 0.0% to 20. The oxygen 1s (O 1s) spectra indicate three different oxygen environments: condensed M-O-M lattice species at 529.9±0.1 eV; bulk and surface metal hydroxide (M-OH) species at 531.3±0.1 eV; and weakly bound (M-OR) species, i.e., $H_2O$ or $CO_2$ at 532.2±0.1 eV. Data of the O1s subpeak ratios for the lowest energy M-O-M peak, M-OH, and highest energy M-OR peak areas to the total O1s peak area are summarized in Table 2 below.

TABLE 2

The percentage of different oxygen 1 s (529.9 ± 0.1 eV: M—O—M lattice oxygen; 531.3 ± 0.1 eV: M—OH metal hydroxide oxygen; 532.2 ± 0.1 eV: M—OR weakly oxygen species) from deconvolution analysis under the indicated temperatures.

| Doping percentage | | 0 | 1% | 5% | 10% | 20% |
|---|---|---|---|---|---|---|
| 225° C. | M—O—M (%) | 52.6 | 38.7 | 38.1 | 38.6 | 35.4 |
|  | M—OH (%) | 28.2 | 34.7 | 39.3 | 39.8 | 40.8 |
|  | M—OR (%) | 19.2 | 26.6 | 22.6 | 21.4 | 23.8 |
| 250° C. | M—O—M (%) | 56.7 | 56.3 | 49.6 | 45.5 | 40.2 |
|  | M—OH (%) | 24.4 | 26.9 | 34.7 | 37.9 | 43.1 |
|  | M—OR (%) | 18.9 | 16.8 | 15.7 | 16.5 | 16.7 |

Referring to Table 2, it can be seen that M-O-M lattice species decreases from 52.6% to 35.4% as the PVP content increases from 0.0% to 20% for 225° C. processing, and from 56.7% to 40.2% for 250° C. processing. It is generally accepted that the charge transport in MO semiconductors relies on extensive M-O-M lattice network formation, while M-OH species and weakly bond species M-OR can act as electron traps. Note that greater M-O-M lattice content in $In_2O_3$ also reflects higher crystallinity in most cases.

However, while sizeable M-O-M content in MO films is essential for efficient charge transport, the electrical performance of crystalline MO films may suffer from electrical inhomogeneity, structural defects, and film cracking on flexible substrates, caused by grain boundaries. Furthermore, the edge sharing In—$O_6$ octahedra structural nature of $In_2O_3$ can result in poor control of carrier densities, leading to high off-currents in TFT devices. Therefore, an accurate balance between M-O-M and M-OH/M-OR content may help control the carrier densities.

Accordingly, an aspect of the present teachings relates to providing MO thin film semiconductors with an optimal polymer content as a compromise between M-O-M content, connectivity between $In_2O_3$ nano-grains, and mechanical stress tolerance.

It has been reported that high-mobility MO semiconducting films that are solution-phase processable at low-temperatures can be achieved using redox precursors that are specifically intended to react in a combustion reaction. See e.g., U.S. Pat. Nos. 8,940,578 and 8,940,579, and U.S. patent application Ser. No. 14/493,280. To benefit from the use of these precursors, it is important to address whether polymers such as PVP are stable to the highly exothermic combustion process used to form the MO film or whether a substantial amount of oxidation/decomposition byproducts accumulate in the blend.

Figure 9:
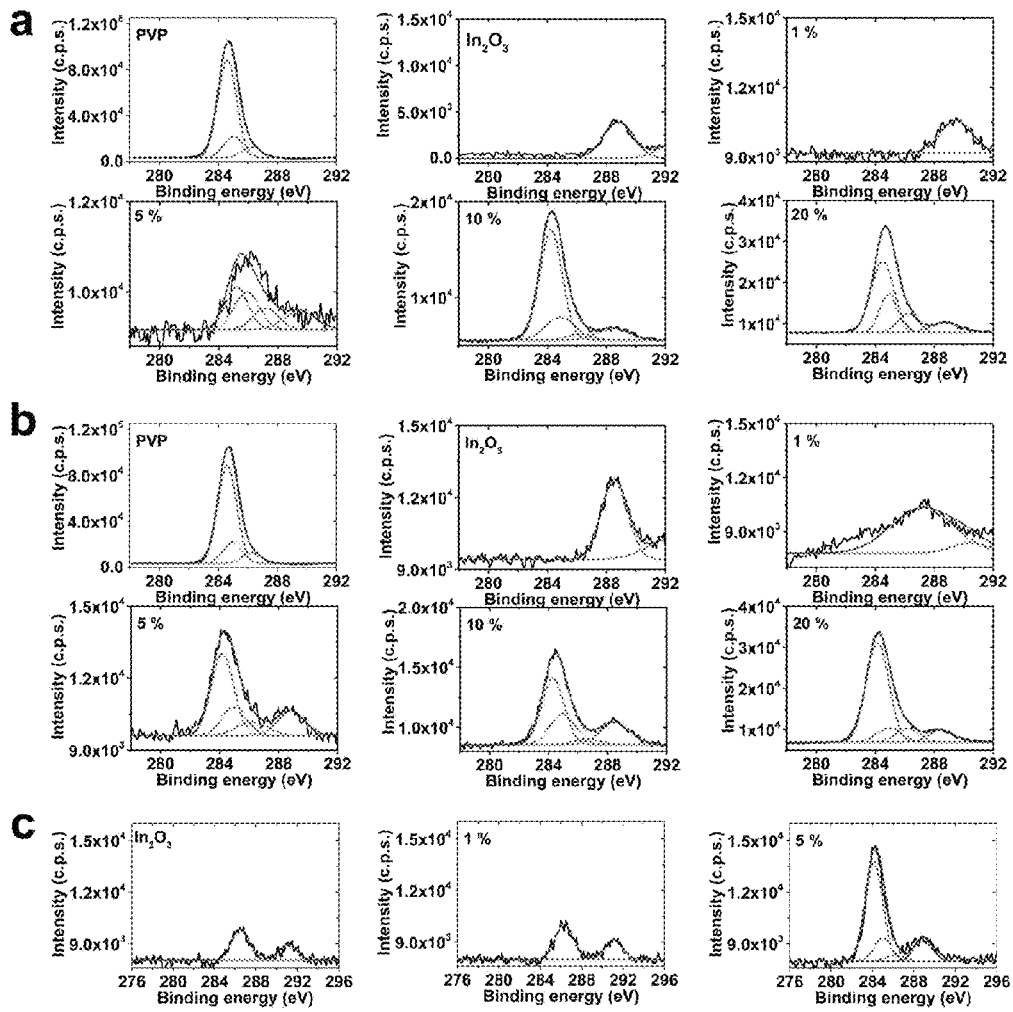
FIG. 9 shows XPS C 1s spectra of pure PVP, pure In$_2$O$_3$ films, and In$_2$O$_3$:PVP blend films obtained with (a) combustion precursors processed at 225° C., (b) combustion precursors processed at 250° C., and (c) sol-gel (no fuel added) precursors processed at 225° C.

To address these questions, XPS carbon 1s (C 1s) spectra of PVP, $In_2O_3$, and $In_2O_3$:PVP blend films were next investigated (FIG. 9). From the literature, the PVP C 1s peak has contributions from aromatic carbon-carbon bonds (~284.5 eV), carbon-carbon single bonds of the polymer backbone (~285.0 eV), and carbon-oxygen single bonds (~286.2 eV), which are identifiable in the pure PVP control samples. In pure $In_2O_3$ films, only a very weak C 1s feature was observed at a binding energy of ~288.6 eV, which can be attributed to adventitious surface contamination arising from carbon oxides or weakly bound organic species. In contrast, the XPS data of the $In_2O_3$:PVP blends suggest that, with the exception of the 1% PVP content sample which falls below the current XPS sensitivity limit, the C 1s peaks can be fitted to PVP aromatic, C—C, and C—O bonds and with the intensities increasing with the PVP concentration, suggesting stability of the polymer during and after the MO lattice formation process. These data are comparable to the corresponding spectra (FIG. 9c cf. FIGS. 9a and 9b) obtained from MO films prepared with conventional sol-gel precursors (metal nitrate reacting with an alkoxide without fuel), thus avoiding the combustion process. The results suggest that the PVP macromolecules are largely retained through the 225° C. and 250° C. combustion processing and, equally important, PVP does not act as a fuel in these formulations.

Figure 10:
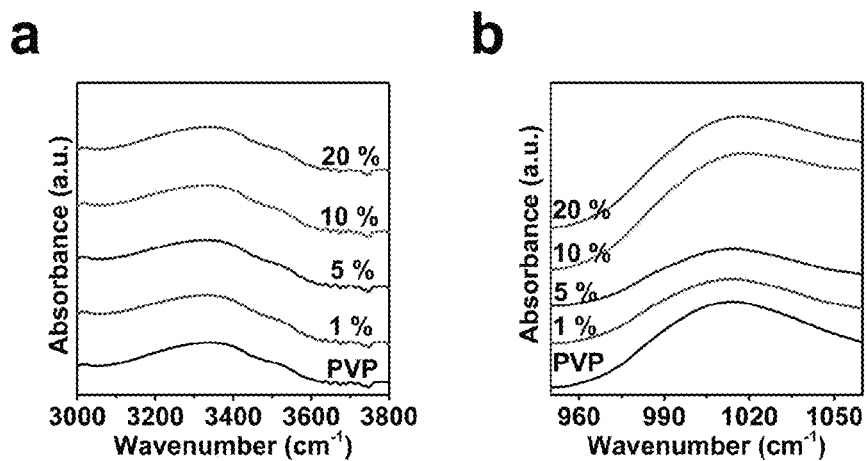
FIG. 10 shows FTIR spectra of In$_2$O$_3$:PVP blend films processed at 225° C. (a) in the 3000-3800 cm$^{-1}$ region and (b) in the 950-1050 cm$^{-1}$ region.
Figure 11:
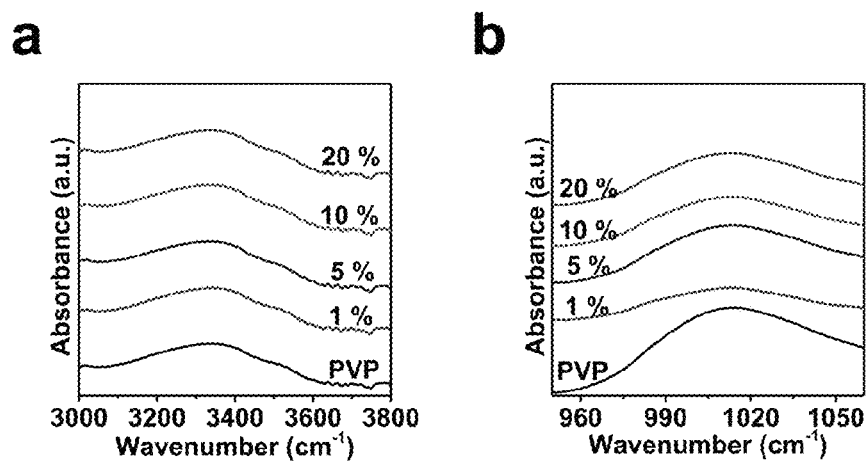
FIG. 11 shows FTIR spectra of In$_2$O$_3$:PVP blend films processed at 250° C. (a) in the 3000-3800 cm$^{-1}$ region and (b) in the 950-1050 cm$^{-1}$ region.

Fourier-transform infrared (FTIR) spectroscopy was performed to further probe for any structural changes in the PVP skeleton. FIGS. 10 and 11 show the FTIR spectra of pure PVP and $In_2O_3$:PVP blend films after processing at two different temperatures. In all samples, the PVP hydroxyl band diagnostic of H-bonded hydroxyl groups (3360 cm$^{-1}$) and free hydroxyl groups (3520 cm$^{-1}$) is identical. In addition to the hydroxyl stretching modes, another characteristic PVP band around 1020 cm$^{-1}$, assignable to aromatic ring modes, is observed in both pure PVP and in the $In_2O_3$:PVP blend films, providing further evidence of the PVP oxidative stability. These results can be qualitatively ascribed to the endothermic M-O-M lattice formation acting as heat absorber and the ultra-thin film oxide thickness providing a large radiative area for heat dissipation, which minimizes damage to the PVP polymer.

By combining the microstructural data here and the TFT performance results from Example 1, the inventors concluded that a PVP content of less than 20% by weight (but at 1% by weight or more) allows $In_2O_3$ semiconducting films to have acceptable TFT performance, while having an amorphous microstructure. Specifically, a PVP content of 5% by weight would be used in subsequent examples with $In_2O_3$ films and TFTs.

Example 3

Polymer-Doped MO TFTs with $AlO_x$ Gate Dielectric

To further enhance TFT device performance at low operating voltages, $AlO_x$ was used as the gate dielectric instead of $SiO_2$. Specifically, TFTs having the structure Si/$AlO_x$/$In_2O_3$:5% PVP/Al were fabricated, i.e., n$^{++}$-Si was employed as gate electrodes/substrates, a spin-coated 93 nm thick $AlO_x$ film (unit capacitance determined to be 90.5 nF·cm$^{-2}$) was used as the gate dielectric layer, $In_2O_3$:5% PVP was used as the MO semiconductor channel layer, and Al source/drain electrodes (150 nm thick) were deposited by plasma laser deposition (PLD) through a shadow mask, providing devices with a channel length (L) of about 50 m and a channel width (W) of about 1 mm. PLD was achieved with a 248 nm KrF excimer laser having a 25 ns pulse duration and operated at 2 Hz. The 200 mJ/pulse beam was focused onto a 1 mm×2 mm spot size. The target was rotated at about 5 rpm to prevent localized heating. The target-substrate separation was fixed at 10 cm.

Figure 12:
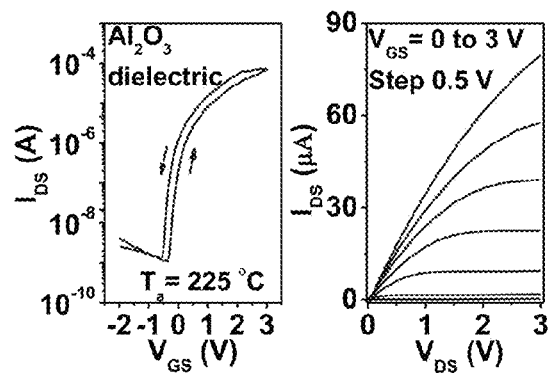
FIG. 12 shows representative transfer and output characteristics of a polymer-doped metal oxide (MO) TFT according to the present teachings (with the structure Si/AlO$_x$/In$_2$O$_3$:5% PVP/Al).

The resulting Si/$AlO_x$/$In_2O_3$:5% PVP/Al TFTs exhibit substantially improved performance compared to those described in Example 1, with $\mu$~16.5 cm$^2$ V$^{-1}$ s$^{-1}$, $V_T$~0.6 V, and $I_{on}/I_{off}$~10$^5$ for annealing at 225° C. (FIG. 12). The performance improvement can be ascribed to the reduction of dielectric/MO semiconductor interfacial traps, and agrees with the knowledge that high capacitance dielectrics improve metal oxide TFT performance.

Example 4

Transparent, Flexible Polymer-Doped MO TFTs

In the following series of experiments, the inventors achieved high-mobility, transparent, and ultra-flexible thin film transistors (TFT) at processing temperatures as low as 225° C. by solution-processing an amorphous metal oxide thin film ($In_2O_3$) doped with an insulating polymer (PVP) as the semiconductor component and by replacing Si with AryLite™ polyester as the substrate and using α-ZITO as both the gate and source/drain electrodes.

Bottom-gate top-contact TFTs were fabricated on ZITO-coated AryLite™ substrates. FIG. 13 illustrates the structure of these TFT devices. More specifically, a 200 nm thick amorphous $Zn_{0.3}In_4Sn_{0.3}O_3$ (α-ZITO) film was deposited on AryLite™ substrates (100 m) by PLD at room temperature in an $O_2$ ambient of 7.5 mTorr from dense hot-pressed ZITO-30 (30% In was replaced by Zn: $Zn_{0.3}In_{1.4}Sn_{0.3}O_3$) targets (25 mm diameter) to function as the gate electrode. Next, an $AlO_x$ gate dielectric (k=9.5, 93 nm thick by profilometry) was deposited on the α-ZITO gate electrode by spin-coating/annealing of an alumina dielectric precursor solution, which was prepared by dissolving Al(NO$_3$)$_3$.xH$_2$O (937.8 mg) in 2-methoxyethanol to achieve a 0.25 M solution, and stirring overnight. Three cycles of spin-coating/annealing were performed to achieve the desired thickness, and the annealing was performed at 200° C. for 30 minutes. The channel layer, consisting of a poly(4-vinylphenol) (PVP)-doped (x % by weight) $In_2O_3$ thin film blend, was deposited by spin-coating an $In_2O_3$ precursor/PVP blend solution [$In_2O_3$ precursor: x % PVP; x=1-20% by weight] onto the $AlO_x$ gate dielectric. Next, the spin-coated films were annealed at about 225° C. or about 250° C. to form the doped-metal oxide (MO) lattice. Finally, α-ZITO source/drain electrodes (150 nm thick) were deposited by PLD through a shadow mask, providing devices with a channel length (L) of about 50 m and a channel width (W) of about 1 mm.

The $In_2O_3$ precursor/PVP blend solution was prepared as follows. First, an $In_2O_3$ precursor solution was prepared by dissolving indium(III) nitrate hydrate, In(NO$_3$)$_3$.xH$_2$O, (177.4 mg) in 2-methoxyethanol (10 ml), followed by addition of NH$_4$OH (55 μL) and acetylacetone (100 μL) and stirring overnight. Separately, a polymer solution was prepared by dissolving 100 mg of PVP (M$_W$~25000) in 2-methoxyethanol and stirring overnight to provide a 10 mg/ml PVP solution. To prepare the $In_2O_3$ precursor/PVP blend (MO:polymer) solution, different amounts of the PVP solution was added into the $In_2O_3$ precursor solution to achieve a PVP weight fraction content (x %) from 1% to 20%. After addition, the MO:polymer solutions were stirred for 4h before spin-coating.

AryLite™ was chosen as the substrate due to its good thermal stability and exceptionally high optical transparency. Particularly, optical spectroscopy analysis shows that the average transmittance values of the AryLite™ substrate and of the α-ZITO/AryLite™ film are about 90% and 81% in the visible range (400-700 nm), respectively. Importantly, the average transmittance of a 1.5 cm×1.5 cm TFT array comprising a ZITO/$AlO_x$/$In_2O_3$:5% PVP/α-ZITO/AryLite stack is ~76%, as shown in FIG. 14. An optical image of the corresponding TFT array is shown as the inset of FIG. 14, demonstrating good optical transparency.

Using data from optical spectroscopy (specifically, from the tangent line of the optical absorption α versus photon energy curves), the band gap ($E_g$) of a pure $In_2O_3$ film (annealed at 225° C.) was determined to be 3.01 eV, which is in agreement with literature values. $In_2O_3$ blends having a 5% PVP content ($In_2O_3$:5% PVP) were found to have a slightly higher $E_g$ of ~3.07 eV, probably due to the introduction of the high band gap (>4 eV) polymer.

Because the film morphology of both the dielectric and the semiconductor layers can strongly affect the charge carrier conducting channel of TFT devices, atomic force microscopy (AFM) images were obtained for a first film sample comprising α-ZITO film deposited on an AryLite™ substrate, a second film sample comprising $AlO_x$ deposited on top of an α-ZITO-coated AryLite™ substrate, and a third film sample comprising an $In_2O_3$:5% PVP blend film on an $AlO_x$/α-ZITO/AryLite™ substrate, each having been annealed at 225° C. The images were taken using a Veeco Dimension Icon scanning Probe Microscope in the tapping mode and reveal that the three film samples have smooth, featureless morphologies that are characterized by $σ_{RMS}$ values of 1.08 nm, 0.78 nm, and 0.87 nm, respectively. Previous reports have stated that the $σ_{RMS}$ of AryLite™ substrates is ~1.1 nm, and here the smoother films with $σ_{RMS}$<1 nm for both the dielectric and the blend films can be due to the planarization effect of the spin-coating deposition.

Next, cross-sectional transmission electron microscopy (TEM) was performed to investigate the microstructures of the flexible devices in greater detail. Specifically, cross-sectional TEM measurements were performed using a JEOL-2100F microscope, with samples prepared directly from actual devices using focused ion beam (FIB) techniques (FEI Helios NanoLab 600). A thin Au layer was locally deposited on $In_2O_{3/5}$% PVP coated $AlO_x$/α-ZITO/AryLite™ samples to protect them from damage during the FIB processing. The prepared samples were lifted with an OmniProbe nanomanipulator and transferred to a semispherical Cu TEM grid.

FIG. 16 shows a cross-sectional TEM image of a flexible TFT device with the structure AryLite™/α-ZITO/$AlO_x$/$In_2O_3$:5% PVP/Au ($T_a$=225° C.). It can be seen that the device has well-defined layers, and each layer has uniform thickness across the entire sample area.

Figure 19:
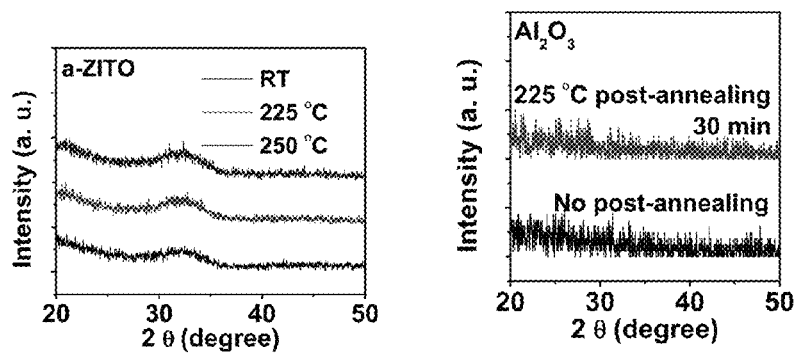
FIG. 19 shows GIXRD plots for an α-ZITO/AryLite™ film measured at room temperature, after annealing at 225° C., and after annealing at 250° C. (left) and for an AlO$_x$ film coated on a Si substrate that was processed at 200° C. and after post-annealing at 225° C. for 30 minutes (right).

The amorphous nature of the various MO layers is very important for affording the mechanical flexibility of the TFT device. FIG. 17 shows energy-dispersive X-ray spectroscopy (EDS) scans of the same device area shown in FIG. 16 for Al, In, Sn, and Zn. The elemental distribution indicates a continuous layer-by-layer structure. The energy-filtered nano-beam diffraction (EF-NBD) patterns of α-ZITO, $AlO_x$, and $In_2O_3$:5% PVP film all show typical "halo rings" characteristic of amorphous films (FIG. 18). These results corroborate with XRD data (FIG. 19) that both the ZITO and $AlO_x$ films are amorphous after annealing at 225° C.

Figure 20:
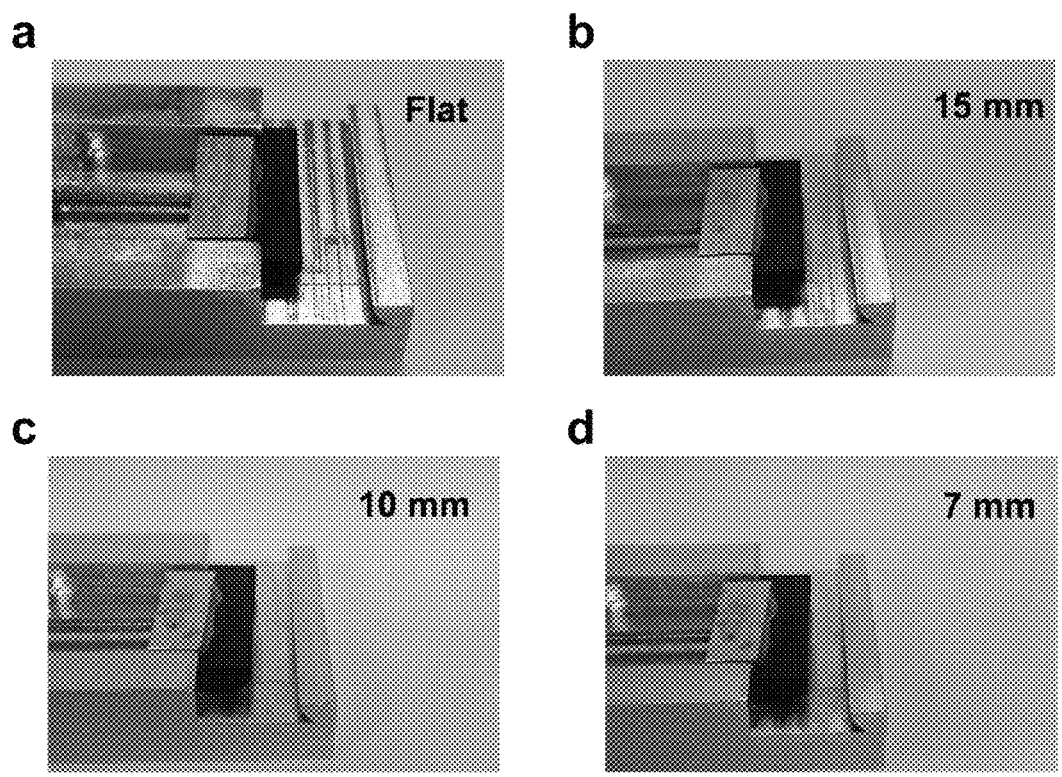
FIG. 20 shows optical images of an all-transparent TFT device according to the present teachings under various bending radii: (a) flat without any bending, (b) bent at a radius of 15 mm, (c) bent at a radius of 10 mm, and (d) bent at a radium of 7 mm.

To characterize systematically the mechanical flexibility of the present all-transparent $In_2O_3$:5% PVP devices, a series of bending tests under controlled conditions were performed (FIG. 20). As comparison, an all-transparent TFT based on pristine $In_2O_3$ as the semiconductor was also measured.

FIG. 21 shows the transfer plots of the $In_2O_3$:5% PVP devices (bottom) as well as the control $In_2O_3$ devices (top) as they were bent at various radii (0 mm, 10 mm, 13 mm, and 15 mm) along a curvature parallel to the channel length. FIG. 22 shows representative output and transfer plots of the $In_2O_3$:5% PVP devices before and after 100 bending cycles at a radius of 10 mm.

FIG. 23 shows the dependence of TFT mobilities against bending radius of both pristine $In_2O_3$ TFTs and all-amorphous $In_2O_3$:5% PVP TFTs. It can be seen clearly that the mobility of pristine $In_2O_3$ TFT deteriorates significantly from 22.2 cm$^2$ V$^{-1}$ s$^{-1}$ (before bending) to 0.5 cm$^2$ V$^{-1}$ s$^{-1}$ as the bending radius is decreased to 10 mm. A large $V_T$ shift from +0.7 V to +1.9 V was also observed. On further decreasing the bending radius to 7 mm, the pristine $In_2O_3$ TFT no longer exhibits a transistor response. In contrast, TFT devices based on amorphous $In_2O_3$:5% PVP as the semiconductor exhibit a negligible mobility decline from 10.9 cm$^2$ V$^{-1}$ s$^{-1}$ to 8.9 cm$^2$ V$^{-1}$ s$^{-1}$ as the bending radius decreases to 10 mm, along with only a slight $V_T$ shift from +0.6 V to +1.2 V.

FIG. 24 shows the electron mobility of the $In_2O_3$:5% PVP devices bent at a radius of 10 mm after up to 100 bending cycles. It can be seen that these devices show excellent mechanical flexibility, with negligible performance decease upon bending at 10 mm even after 100 bending cycles. Moreover, the transfer and output characteristics of $In_2O_3$:5% PVP TFTs almost completely recover when the stain is relaxed, as shown in FIG. 22.

The performance variations upon mechanical stress can be rationalized by analyzing the channel film topology using scanning electron microscopy (SEM). Specifically, SEM images (recorded using an FEI Quanta 600 F sFEG ESEM microscope) of 20 nm thick $In_2O_3$/AryLite™ and $In_2O_3$:5% PVP/AryLite™ films ($Ta$=225° C.) after 100 bending cycles at 10 mm radii indicate extensive crack formation and propagation for the polycrystalline $In_2O_3$ films, whereas the $In_2O_3$:5% PVP films remain continuous and uniform.

Example 5

Additional Polymer-Doped MO TFTs

To demonstrate the generality of the present teachings, poly(vinyl butyral) (PVB), poly(vinyl alcohol) (PVA), and poly(2-hydroxyethyl methacrylate) (p-HEMA) were used instead of PVP to prepare metal oxide precursor/polymer blend solutions ($In_2O_3$:x % polymer, x=1 and 5), which were used to fabricate additional polymer-doped MO TFTs using the same fabrication process and device structure (Si/SiO$_2$/$In_2O_3$:x % polymer/Al) as described in Example 1. The $In_2O_3$:x % PVB devices have the same channel L and W as the $In_2O_3$:x % PVP devices. For the devices doped with PVA or p-HEMA, the channel L and W were 200 m and 1000 μm, respectively.

The respective polymer solutions were prepared as follows. For the PVB solution, 100 mg of PVB ($M_W$~25000) was dissolved by stirring in 2-methoxyethanol overnight to provide a 10 mg/ml solution. For the PVA solution, 100 mg of PVA ($M_W$~10000) was dissolved by stirring in warm distilled water (60° C.) overnight to provide a 10 mg/ml solution. For the p-HEMA solution, 100 mg of p-HEMA ($M_W$~5000) was dissolved by stirring in warm methanol (60° C.) overnight to provide a 10 mg/ml solution.

Figure 25:
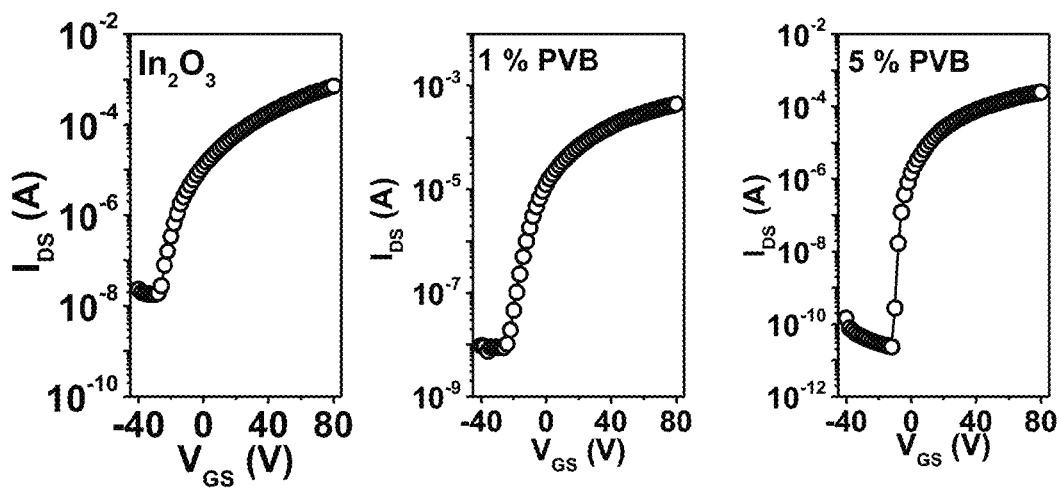
FIG. 25 shows representative transfer I$_{DS}$-V$_{GS}$ plots for pristine In$_2$O$_3$ (In$_2$O$_3$, left), In$_2$O$_3$:1% PVB (1% PVB, middle), and In$_2$O$_3$:5% PVB (5% PVB, right) TFT devices processed at 250° C.

Representative transfer $I_{DS}$–$V_{GS}$ characteristics for pristine $In_2O_3$, $In_2O_{3:1}$% PVB, and $In_2O_3$:5% PVB TFT devices processed at 250° C. are shown in FIG. 25. Table 3 below summarizes the key TFT performance parameters.

TABLE 3

Performance metrics for In$_2$O$_3$ TFTs doped
with different PVB concentrations.

| T$_a$ | TFT | PVB Doping (%) | | |
|---|---|---|---|---|
| (° C.) | Performance | 0 | 1 | 5 |
| 225 | μ (cm$^2$V$^{-1}$s$^{-1}$) | 1.52 ± 0.06 | 0.94 ± 0.08 | 0.66 ± 0.08 |
| | V$_T$ (V) | 2.8 ± 2.4 | 6.5 ± 5.7 | 12.4 ± 4.7 |
| | I$_{on}$/I$_{off}$ | 10$^4$-10$^5$ | 10$^5$-10$^6$ | 10$^6$-10$^7$ |

Figure 26:
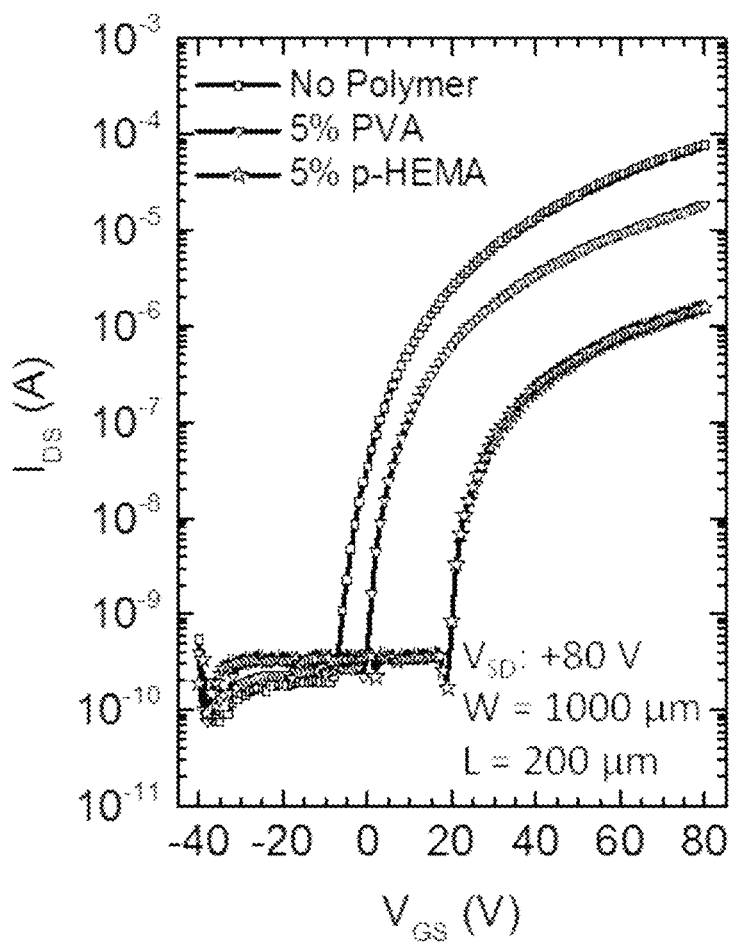
FIG. 26 shows representative transfer I$_{DS}$-V$_{GS}$ characteristics for pristine In$_2$O$_3$ (squares), In$_2$O$_3$:5% PVA (triangles), and In$_2$O$_3$:5% p-HEMA (stars) TFT devices processed at 250° C.

FIG. 26 shows representative transfer I$_D$S—V$_{GS}$ characteristics for pristine In$_2$O$_3$ (squares), In$_2$O$_3$:5% PVA (triangles), and In$_2$O$_3$:5% p-HEMA (stars) TFT devices processed at 250° C.

These results show that various electrically insulating polymers can be introduced into the lattice of a metal oxide thin film semiconductor at a low percentage (e.g., around 5% or less) to impart mechanical flexibility while retaining good electronic properties such as satisfactory charge carrier mobility (μ), threshold voltage (V$_T$), and current on/off ratio (I$_{on}$/I$_{off}$).

To demonstrate further the generality of the present teachings, ZnO, IGO (In:Ga=0.90:0.10 mol), ZTO (Zn:Sn=1.00: 1.00 mol), and IGZO (In:Ga:Zn=1.00:0.11:0.29 mol) were used instead of In$_2$O$_3$ to prepare metal oxide precursor/polymer blend solutions with PVP as the polymer (MO: 1% polymer), which were used to fabricate additional polymer-doped MO TFTs using the same fabrication process and device structure (Si/SiO$_2$/In$_2$O$_3$:x % polymer/Al) as described in Example 1. These TFTs had channel L=50 to 200 m and W from 500 to 5000 m, respectively.

For ZnO, Zn and Sn precursor solutions were prepared separately by dissolving 330 mg of Zn(CH$_3$COO)$_2$.2H$_2$O in 10 ml of 2-methoxyethanol, then adding 300 μL of etha-nolamine. Separately, a polymer solution was prepared by dissolving 100 mg of PVP (M$_W$~25000) in 2-methoxyethanol and stirring overnight to provide a 10 mg/ml PVP solution. Next, the PVP solution was added to achieve a 1 wt % PVP content. After addition, the ZnO:PVP solution was stirred for 3h before spin-coating. The ZnO: 1% PVP films were annealed in dry air at 350° C. for 1h. The following TFT characteristics were observed: μ(cm$^2$ V$^{-1}$ s$^{-1}$)=0.4-1.1 cm$^2$ V$^{-1}$ s$^{-1}$, V$_T$(V)=−13-0; I$_{on}$/I$_{off}$=10$^4$-10$^6$.

For IGO, MO precursor/PVP blend solutions were prepared as follows. In and Ga precursor solutions were prepared separately by dissolving In(NO$_3$)$_3$.5H$_2$O (195.4 mg) and Ga(NO$_3$)$_3$.5.5H$_2$O (177.5 mg), respectively, in 10 mL of 2-methoxyethanol, then adding 0.10 mL of acetylacetone. After stirring for 10 minutes, 57 L of 14.5 M NH$_3$ (aq) was added and the solution was aged for 12 h (In) and 48h (Ga), respectively. Separately, a polymer solution was prepared by dissolving 100 mg of PVP (M$_W$~25000) in 2-methoxyethanol and stirring overnight to provide a 10 mg/ml PVP solution. The In and Ga precursor solutions were mixed to achieve an In:Ga molar ratio of 90:10. Next, the PVP solution was added to achieve a 1 wt % PVP content. After addition, the MO:PVP blend solution was stirred for 4h before spin-coating. The IGO:1% PVP films were annealed in dry air at 300° C. for 30 min. The following TFT characteristics were observed: μ(cm$^2$ V$^{-1}$ s$^{-1}$)=5.5-6.2 cm$^2$ V$^{-1}$ s$^{-1}$, V$_T$(V)=−20-0; I$_{on}$/I$_{off}$=10$^3$-10$^5$.

For ZTO, Zn and Sn precursor solutions were prepared separately by dissolving 164.7 mg of Zn(CH$_3$COO)$_2$.2H$_2$O and 144.2 mg of SnCl$_2$, respectively, in 5 ml of 2-methoxyethanol, then adding 154 μL of ethanolamine. Separately, a polymer solution was prepared by dissolving 100 mg of PVP (M$_W$~25000) in 2-methoxyethanol and stirring overnight to provide a 10 mg/ml PVP solution. Next, the PVP solution was added to achieve a 1 wt % PVP content. After addition, the IZO:PVP solution was stirred for 4h before spin-coating. The IZO:1% PVP films were annealed in dry air at 350° C. for 30 min. The following TFT characteristics were observed: μ(cm$^2$ V$^{-1}$ s$^{-1}$)=0.9-1.3 cm$^2$ V$^{-1}$ s$^{-1}$, V$_T$(V)=−10-+5; I$_{on}$/I$_{off}$=10$^4$-10$^5$.

For IGZO, In, Ga, and Zn solutions were prepared with In(NO$_3$)$_3$.xH$_2$O, Zn(NO$_3$)$_2$.xH$_2$O, and Ga(NO$_3$)$_3$.xH$_2$O in 2-methoxyethanol to yield 0.05 M solutions. Next, 55 μL of NH$_4$OH and 100 μL acetylactone were added to 10 mL of the metal solutions and stirred for 10 h at 25° C. Separately, a polymer solution was prepared by dissolving 100 mg of PVP (M$_W$~25000) in 2-methoxyethanol and stirring overnight to provide a 10 mg/ml PVP solution. The metal solutions were combined in the desired molar ratios, followed by addition of the PVP solution to achieve a 1 wt % PVP content. The IGZO: 1% PVP precursor solution was stirred for 2h before spin-coating. For 20 nm thick IGZO TFT devices, the precursor solutions were spin-coated and then annealed for 30 min at 300-400° C.; this was repeated 4× to achieve the desired thickness. The following TFT characteristics were observed: μ(cm$^2$ V$^{-1}$ s$^{-1}$)=1.5-3.2 cm$^2$ V$^{-1}$ s$^{-1}$, V$_T$(V)=+10-+20; I$_{on}$/I$_{off}$=10$^6$-10$^8$.

Example 6

Polymer-Doped MO Conducting Films

Electrically insulating polymers also can be added to a conducting oxide film to afford the MO conductor with enhanced mechanical flexibility. Crystallization was frustrated as observed with MO thin film semiconductors, but surprisingly, the conductivity of the amorphous polymer-doped metal oxide conductor is actually higher than the crystalline pristine metal oxide conducting film.

Specifically, ITO was investigated as the transparent conducting oxide, and PVP was used as the polymer. In(NO$_3$)$_3$ and SnCl$_2$ were dissolved in 2 methoxyethanol to achieve a 0.1 M solution with In: Sn=9:1 molar ratio. Then, AcAc and NH$_4$OH were added to form the metal oxide via a combustion reaction. The ITO: polymer solution precursor solutions were prepared by adding an appropriate amount of a PVP solution (see Example 1) to the ITO precursor solution so as to achieve a PVP weight fraction content of 5%. Pristine and polymer-doped ITO films were prepared by spin-coating at 2000 rpm for 30 seconds, followed by annealing for 30 minutes at 250° C., then repeating the spin-coating/annealing cycle multiple times to achieve the desired thickness.

Figure 27:
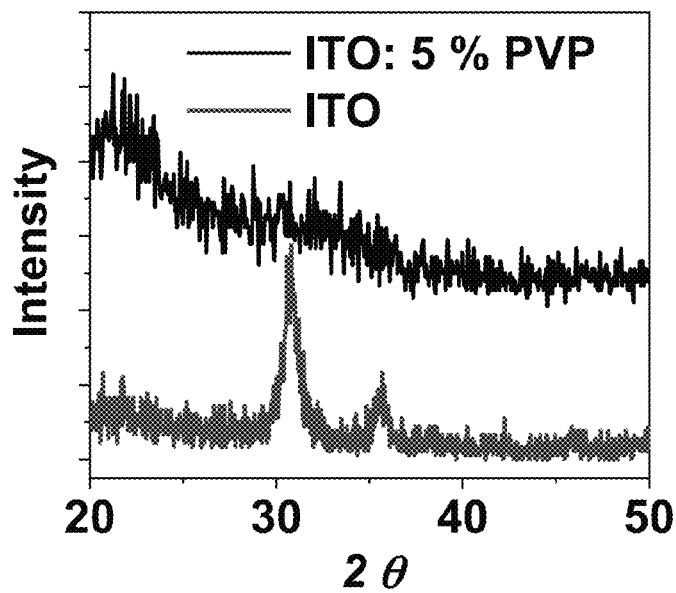
FIG. 27 shows XRD plots for pristine ITO and PVP-doped ITO films processed at 250° C.

FIG. 27 shows XRD plots for pristine ITO and PVP-doped ITO films processed at 250° C. As shown, pristine ITO is crystalline, but with the addition of 5% PVP, the metal oxide conducting film becomes amorphous.

Table 4 shows that the ITO:5% PVP film actually is more conductive than the pristine ITO film.

TABLE 4

Four-probe conductivity measurements
for ITO and ITO-doped films.

| | PVP Doping (%) | |
|---|---|---|
| ITO | 0 | 5 |
| Conductivity (S cm$^{-1}$) | 24.3 ± 4.5 | 57.8 ± 8.4 |

Example 7

Polymer-Doped MO Insulating Films

Metal oxide dielectrics such as Al$_2$O$_3$ can be made more mechanically flexible by blending them with polymer, thereby further improving the overall mechanical flexibility of the entire TFT array. To illustrate, an alumina dielectric precursor solution was prepared by dissolving Al.(NO$_3$)$_3$.xH$_2$O in 2-methoxyethanol to achieve a 0.25 M solution, and then stirred overnight before deposition. The Al$_2$O$_3$:polymer precursor solutions were prepared by adding the appropriate amount of a PVP solution (see Example 1) to the Al$_2$O$_3$ precursor solution so as to achieve a 5% PVP weight. After addition, these solutions were stirred for 4h before deposition. Pristine Al$_2$O$_3$ and Al$_2$O$_3$:polymer precursor solutions were spin-coated onto Si substrates and then annealed at 200° C. for 30 minutes. This spin-coating/annealing process was repeated 3 times.

Figure 28:
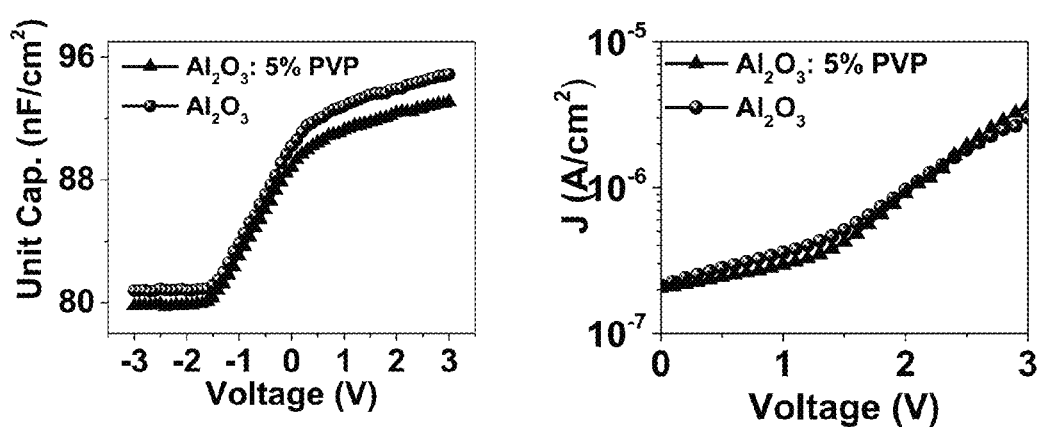
FIG. 28 shows capacitance-voltage (left) and current density-voltage (right) plots for Al$_2$O$_3$ and PVP-doped Al$_2$O$_3$ films processed at 200° C.

FIG. 28 shows capacitance-voltage (left) and current density (J)-voltage (V) plots for Al$_2$O$_3$ and PVP-doped Al$_2$O$_3$ films processed at 200° C. Table 5 summarizes the dielectric properties of Al$_2$O$_3$ and PVP-doped Al$_2$O$_3$ films.

TABLE 5

Dielectric properties of Al$_2$O$_3$ and PVP-doped Al$_2$O$_3$ films.

|  | PVP Doping (%) | |
| --- | --- | --- |
| Al$_2$O$_3$ | 0 | 5 |
| Capacitance nF/cm$^2$ | 95 | 92 |
| J at 2 V | 10$^{-7}$ | 10$^{-7}$ |

Example 8

PEI-Doped MO TFTs

Polyethyleneimine (PEI) contains one of the highest density of amine groups among all polymers and is known to exhibit efficient n-doping due to the electron-transfer ability of the tertiary amine groups.

The transport properties of PEI-doped MO TFTs were investigated in bottom-gate top-contact TFTs measured in ambient conditions. Briefly, TFTs were prepared on n++ Si wafers with 300 nm thermally grown SiO$_2$ serving as gate electrodes and dielectrics, respectively. Before spin-coating, the substrates were cleaned ultrasonically in isopropyl alcohol and oxygen plasma. The channel layer, consisting of an x % by weight PEI-doped In$_2$O$_3$ blend (x % PEI:In$_2$O$_3$; x=0-8%) was deposited from a PEI-In$_2$O$_3$ precursor solution via spin-coating at 3000 rpm for 20 s. Next, the spin-coated films were annealed at 250° C. for 30 minutes. This process was repeated three times to achieve the desired film thickness. Finally, 40 nm thick Al source/drain electrodes were deposited by thermal evaporation through a shadow mask (channel length L=100 μm, channel width W=1 mm).

The In$_2$O$_3$ precursor/PEI blend solution was prepared as follows. First, an In$_2$O$_3$ precursor solution was prepared by dissolving indium(III) nitrate hydrate, In(NO$_3$)$_3$.xH$_2$O, (354.8 mg) in 10 mL of high purity deionized water. PEI (Sigma-Aldrich, average M$_w$~25,000 by LS, average M$_n$~10,000 by GPC, branched) was also dissolved in DI water to form a PEI solution with a concentration of 20 mg/mL. Both solutions were stirred for at least 6 h. Subsequently, the PEI solution was added into the In$_2$O$_3$ precursor solution to provide the desired PEI weight fraction content (x %). After addition, the In$_2$O$_3$ precursor/PEI blend solutions were stirred for 8h before spin-coating.

TFT characterization was performed under ambient conditions on a custom probe station using an Agilent 1500 semiconductor parameter analyzer. The charge carrier mobility μ was evaluated in the saturation region with the conventional MOSFET model by equation (1) provided in Example 1.

Figure 29:
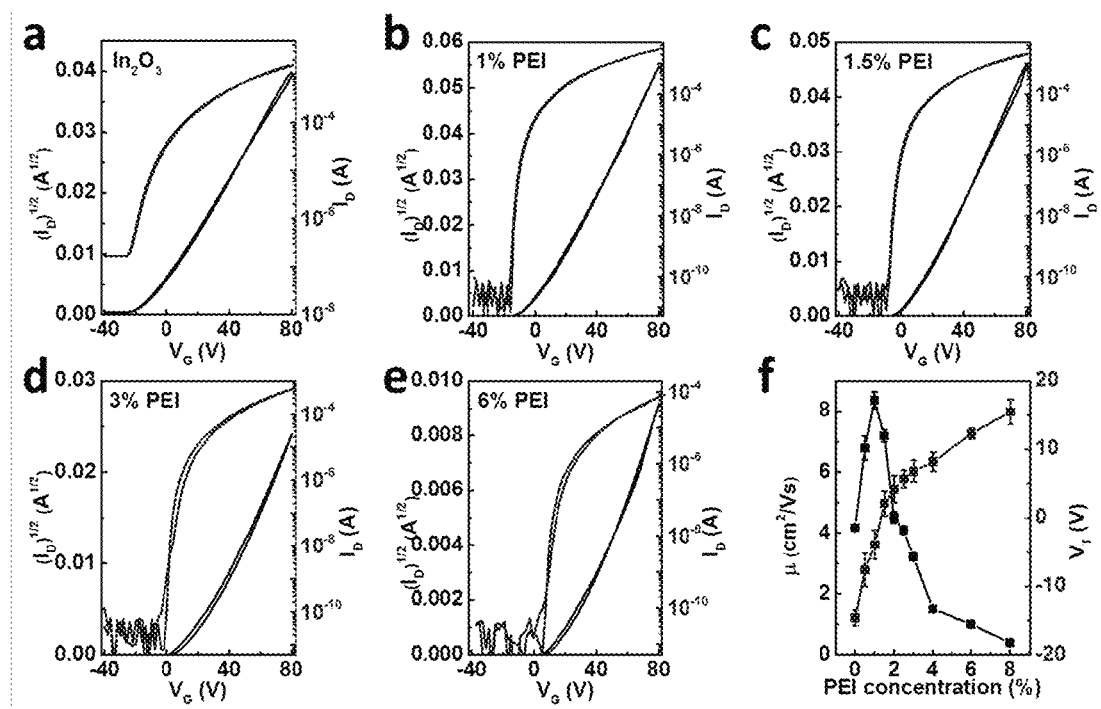
FIG. 29 shows representative transfer characteristics for PEI-doped metal oxide TFTs: a) neat In$_2$O$_3$ transistor, b) 1% PEI-doped In$_2$O$_3$ transistor, c) 1.5% PEI-doped In$_2$O$_3$ transistor, d) 3% PEI-doped In$_2$O$_3$ transistor, e) 6% PEI-doped In$_2$O$_3$ transistor, and f) charge carrier mobility and threshold voltage for In$_2$O$_3$: x % PEI transistors with different PEI concentrations.
Figure 30:
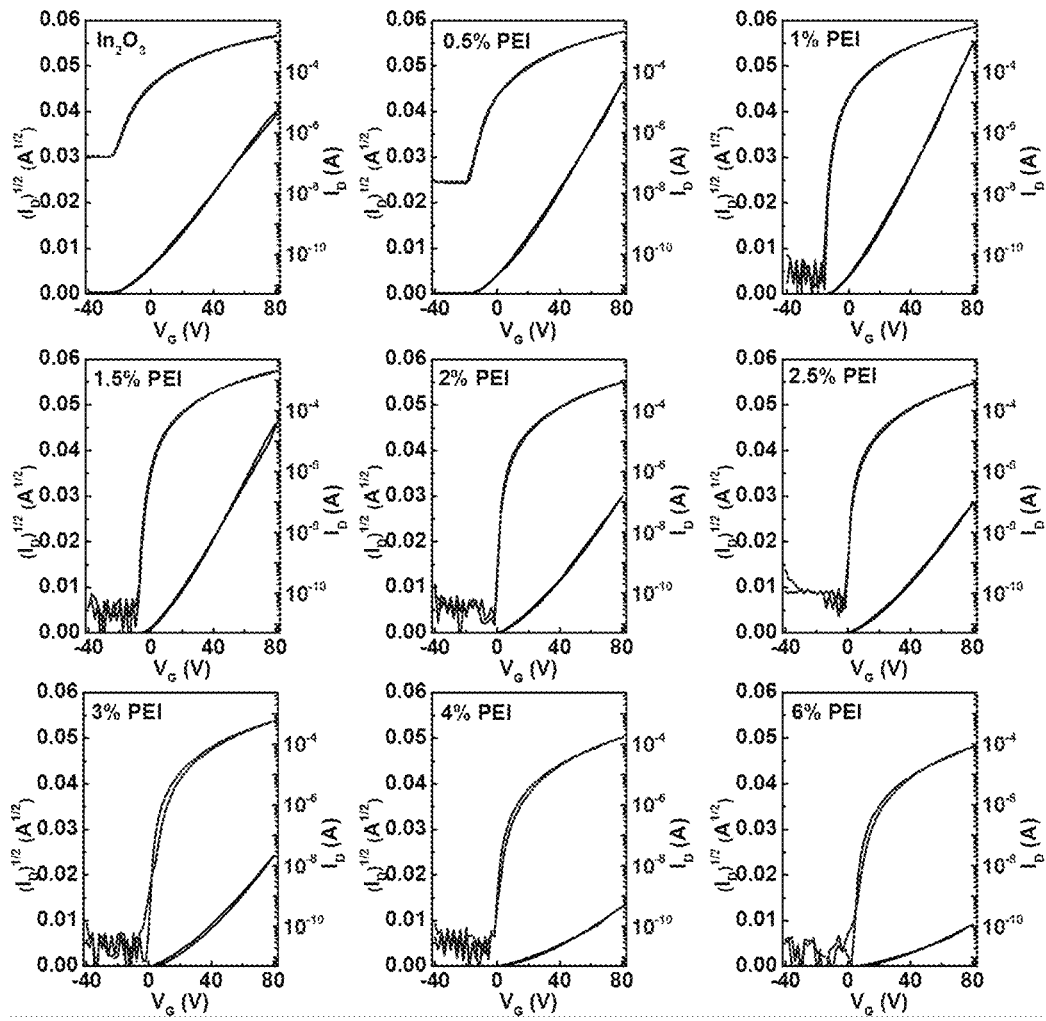
FIG. 30 shows transfer plots of In$_2$O$_3$ TFTs with various PEI doping concentrations.
Figure 31:
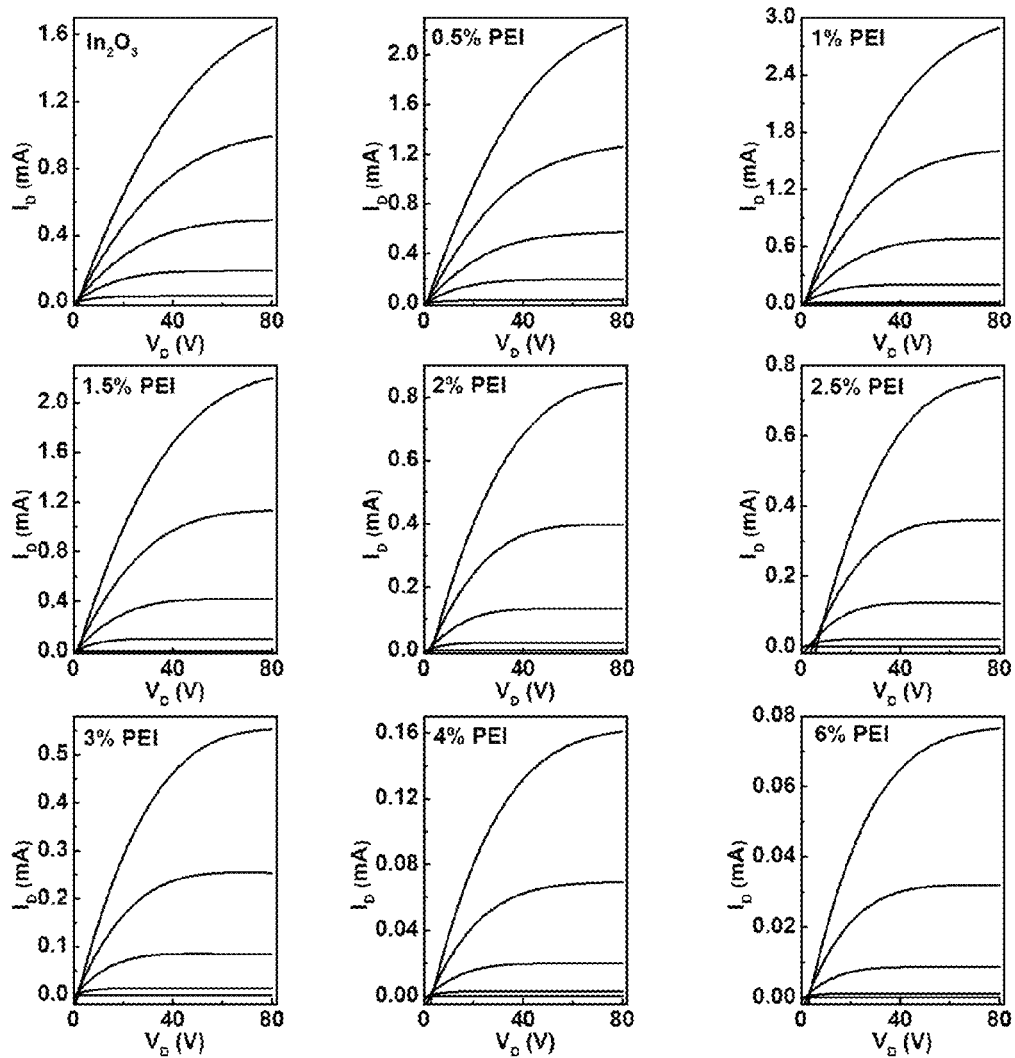
FIG. 31 shows output plots of In$_2$O$_3$ TFTs with various PEI doping concentrations.

PEI doping was found to have a profound influence on the performance of In$_2$O$_3$ transistors. FIGS. 29, 30 and 31 show representative I-V characteristics for the investigated PEI-doped transistors. Referring to FIG. 30, the transport measurements clearly indicate that the off-current (I$_{off}$) decreases from ~10$^{-7}$ A to ~10$^{-11}$ A when the PEI content increases from 0% to 1.5% and then stabilizes at higher PEI content (≥1.5%). Interestingly, the on-current (I$_{on}$) follows a different behavior than the I$_{off}$ and does not monotonically decreases as the concentration of the polymer dopant increases unlike what was observed for PVP doping (c.f. FIGS. 1 and 2). Specifically, I$_{on}$ increases from 1.5×10$^{-3}$ A (0% PEI) to 2.1×10$^{-3}$ A (0.5% PEI) to 3.0×10$^{-3}$ A (1% PEI). Then, the on-current starts to decrease slightly in the region of 1.5%~3% (from 2.1×10$^{-3}$ A at 1.5% to 5.8×10$^{-4}$ A at 3%) and then falls significantly (~10$^{-5}$ A) for larger PEI contents. Simultaneously, and referring to FIG. 31, the turn-on voltage shifts to a more positive values from ~−24 V for the pristine In$_2$O$_3$ to −14~−9 V for ones with PEI contents of 1%-1.5% to ≥+2 V for larger PEI contents (>4%).

The combined variations of the I-V characteristics result in variations of the key TFT performance parameters (Table 6), which were calculated in the saturation region using conventional MOSFET equations.

TABLE 6

Performance metrics[b] for In$_2$O$_3$:PEI TFTs with different concentrations of PEI.

| PEI concentration | TFT performance | | |
| --- | --- | --- | --- |
| [%] | μ [cm$^2$/Vs] | V$_{th}$ [V] | I$_{on}$/I$_{off}$ |
| 0 | 4.18 ± 0.11 | −14.6 ± 1.1 | 10$^4$ |
| 0.5 | 6.78 ± 0.39 | −7.6 ± 2.4 | 10$^6$ |
| 1.0 | 8.37 ± 0.28 | −3.9 ± 2.1 | 10$^6$~10$^7$ |
| 1.5 | 7.20 ± 0.20 | 2.1 ± 1.8 | 10$^7$ |
| 2.0 | 4.52 ± 0.18 | 4.2 ± 2.0 | 10$^6$~10$^7$ |
| 2.5 | 4.10 ± 0.14 | 5.7 ± 1.3 | 10$^6$~10$^7$ |
| 3.0 | 3.22 ± 0.13 | 6.8 ± 1.6 | 10$^6$~10$^7$ |
| 4.0 | 1.51 ± 0.05 | 8.2 ± 1.4 | 10$^6$~10$^7$ |
| 6.0 | 1.01 ± 0.02 | 12.3 ± 0.8 | 10$^6$ |

[b]Each device metric is the average of a minimum of 10 devices.

Figure 32:
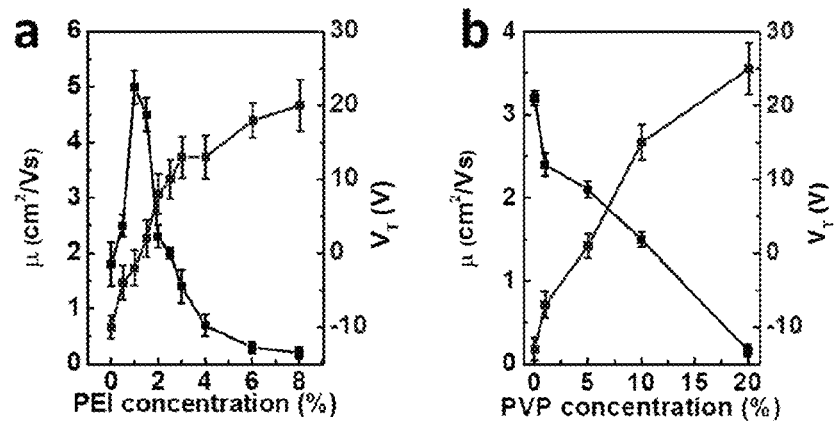
FIG. 32 compares the mobilities of TFTs based on a) PEI doping and b) PVP doping.

As shown in Table 6, the field-effect mobility of In$_2$O$_3$:x % PEI TFTs increases from ~4.2 to ~8.3 cm$^2$/Vs when PEI increases from 0% to 1-1.5%, then decreases back to ~4 cm$^2$/Vs at PEI concentration of 2-2.5% and then falling to ≤1 cm$^2$/Vs at >6% PEI concentration. Concurrently, the I$_{on}$/I$_{off}$ abruptly increases from ~10$^4$ (0% PEI) to ~10$^6$ (0.5% PEI), maximizes at ~10$^7$ at 1.5% PEI, then remaining in the same level (10$^6$~10$^7$) for the other compositions. Interestingly, V$_{th}$ shifts to a more positive values when the PEI concentration increases, reaching an optimal value of ~0 V for PEI concentrations of 1-1.5%. Thus, PEI doping has a unique influence on the transistor performance; the electron doping seems to have an enhancing effect while scattering reduces transistor performance. The mechanism of how PEI operates, therefore, appears very different than that observed when doping In$_2$O$_3$ with light elements such as Ga and Zn or an amine-free insulating polymer such as PVP, which always results in lower electron mobility when an optimal I$_{on}$/I$_{off}$ ratio and V$_T$ are obtained (FIG. 32).

Therefore, the above results show that metal oxide transistors incorporating a In$_2$O$_3$/PEI blend semiconductor channel layer, where the PEI is present in the In$_2$O$_3$ matrix at 0.5%-2.5% by weight, can achieve device performance exceeding those of the pure $In_2O_3$ matrix. In particular, a mobility higher than ~8 $cm^2/Vs$ was achieved on 300 nm silicon oxide dielectric, while achieving excellent on/off ratio (~$10^7$), and near-zero $V_T$(-3.9 V).

To rationalize the performance improvement of $In_2O_3$:x % PEI blends, the surface morphologies of $In_2O_3$ thin film semiconductors with various PEI content were analyzed through atomic force microscopy (AFM) and scanning electron microscopy (SEM). Specifically, AFM film topographies were imaged with a Veeco Demension Icon scanning Probe Microscope using tapping mode. SEM characterizations were carried out on a Hitachi SU8030 FE-SEM. The AFM and SEM images indicate that all semiconducting films are very smooth, with only a slight increase of the root-mean-square (rms) roughness from 0.33 nm (0% of PEI) to 0.55 nm (6% of PEI). The SEM images also suggest no obvious phase separation upon PEI doping.

Figure 33:
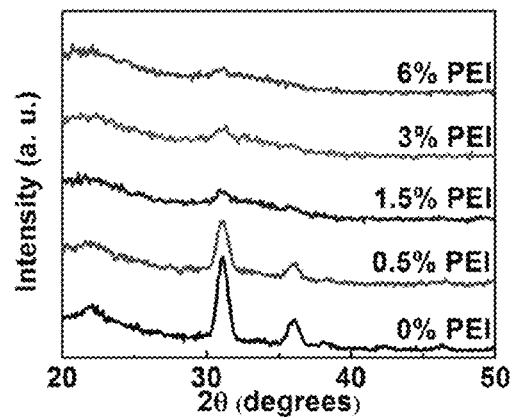
FIG. 33 shows GIXRD patterns of In$_2$O$_3$:polymer films with various PEI concentrations.

The microstructure of the $In_2O_3$:x % PEI blends was conducted with grazing incidence X-ray diffraction (GIXRD). The GIXRD measurements were carried out with a Rigaku SmartLab Thin-film Diffraction Workstation using a high intensity 9 kW copper rotating anode x-ray source which is coupled to a multilayer optic. FIG. 33 indicates that the pristine $In_2O_3$ film is polycrystalline as evidenced by the very sharp and strong reflection at 2θ=31.1° (222) detected along with several weaker reflections at 22.1° (211), 36.0° (400), and 46.3° (431). PEI doping of the $In_2O_3$ films strongly frustrates crystallization especially for compositions with PEI >1%. After subtraction of the amorphous $SiO_x$ peak, the degree of crystallinity ($\chi_c$) of the $In_2O_3$:x % PEI blends was estimated from the ratio of the area under the crystalline peaks (after subtracting the amorphous peak) to the total area under the X-ray diffraction pattern. The diffraction peaks were fitted with a pseudo-Voigt function (Gaussian-Lorentzian product). The $\chi_c$ of neat $In_2O_3$ is ~70% which decreases to ~50% for 0.5% PEI doping. Importantly, $\chi_c$ dramatically decrease to ~9%, 7%, and 4% as the PEI doping increases to 1.5%, 3%, and 6%, respectively. These results show that $In_2O_3$:x % PEI films for x %>1% are mostly amorphous.

Next, X-ray photoelectron spectroscopy (XPS) was utilized to better understand the overall chemical environment for different $In_2O_3$:PEI compositions. Specifically, XPS was performed on Thermo Scientific ESCALAB 250Xi at a base pressure of $4.5\times10^{-10}$ mbar (UHV). XPS spectra were obtained after the surface of the film was etched for about 2 nm to minimize surface contamination.

Figure 34:
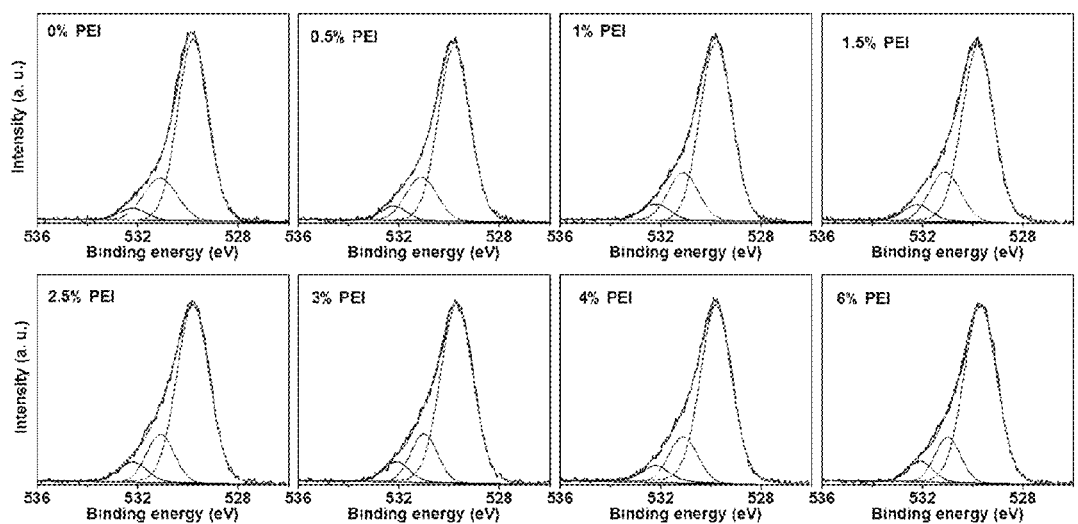
FIG. 34 shows XPS spectra of In$_2$O$_3$:polymer films with different PEI concentrations.

As shown in FIG. 34, the O1s spectra of all the films have similar peak shapes, which can be fitted with three individual components: (1) M-O-M lattice species at 529.8±0.1 eV, (2) bulk and surface metal hydroxide (M-OH) species at 531.1±0.1 eV, and (3) weakly bound (M-OR) species such as $H_2O$ or $CO_2$ at 532.2±0.1 eV. Interestingly, as the concentration of PEI increases for 0% to 6%, the oxygen content for each species remain in the same range and amount at ~75-76% for M-O-M, 17-19% for M-OH, and ~5-8% for M-OR. Given sufficient M-O-M lattice formation is essential to achieve good charge transport in metal oxide semiconductors, and PEI-induced amorphous phases contain the same amount of M-O-M lattice (more than 70%) as the mostly crystalline $In_2O_3$ matrix, the XPS data therefore is consistent with the high electron mobilities observed for PEI doped $In_2O_3$ compositions.

Figure 35:
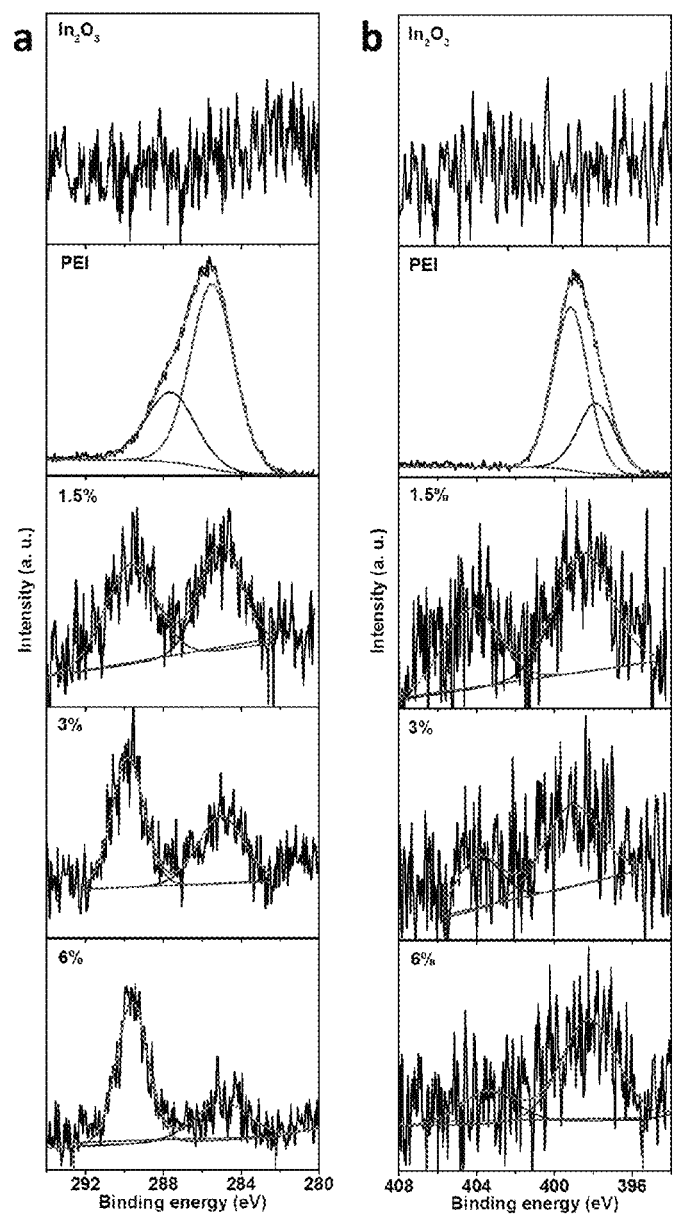
FIG. 35 shows a) XPS C 1s spectra of pure In$_2$O$_3$ films, PEI films, and In$_2$O$_3$:PEI blend films; and b) XPS N 1s spectra of pure In$_2$O$_3$ films, PEI films, and In$_2$O$_3$:PEI blend films.

To monitor chemical composition changes in $In_2O_3$:x % PEI blend films during sol-gel synthesis, further XPS analyses were carried out. Specifically, PEI is known to start decomposing at around 250° C. FIG. 35 indicates that while the neat $In_2O_3$ films do not contain any traceable amounts of carbon nor nitrogen, PEI doping both at low (1-1.5%) or high concentrations (6%) results in clearly detectable N 1s and C1s peaks. Thus, even after synthesis of $In_2O_3$ at 250° C., the major elements of PEI are present and not just as a contamination. However, both C 1s and N 1s binding energies shift considerably compared to pristine PEI. From the literature, the PEI C 1s peak at 285.5 eV is assigned to C—C and C—N bonds whereas the additional peak at 287.5 eV might be due to C=O (potentially contributed by chain hydrolysis and/or C—$NR_3^+$ due to amine group quaternization. The C 1s peak in the $In_2O_3$:PEI blends can be fitted into two peaks at ~285.5 eV and ~289.0 eV, the latter associated to C=O, C—$NR_3^+$ and more complicated carbon-oxygen bond species. Moreover, this peak intensifies as the PEI concentration increases, suggesting that PEI has strong reaction with oxygen during the annealing process. The N 1s binding energies in PEI are assigned to the C—N bound (399.0 eV) and to strongly adsorbed $CO_2$ on any of the nitrogen atoms (397.5 eV). The N 1s peak in $In_2O_3$:PEI blends exhibit two peaks located at 398.0~399.0 eV and at 403.0~404.0 eV assigned to neutral nitrogen atoms partially coordinating indium cations and to positively charged ammonium nitrogen atoms. These results suggest that backbone PEI components remain within the film and that partial oxidation/quaternization/coordination occur during the annealing process.

Figure 36:
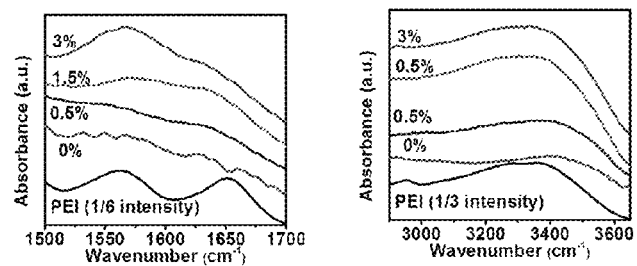
FIG. 36 shows FTIR spectra of PEI films, pure $In_2O_3$ films, and $In_2O_3$:PEI blend films: a) in the 1500~1700 cm$^{-1}$ region; b) in the 3000~3600 region.

Fourier transform infrared (FT-IR) spectroscopy is also utilized to confirm the existence of substantial amount of amine groups. FT-IR spectra were collected by Nexus 870 spectrometer (Thermo Nicolet) with a single reflection horizontal ATR accessory which having a diamond ATR crystal fixed at incident angle of 45°. FIG. 36 shows the IR spectra of PEI and $In_2O_3$:PEI blend films. Amine group peaks at 1560 $cm^{-1}$ and 3200~3400 $cm^{-1}$ are very strong in pure PE film, along with an amide group at 1650 $cm^{-1}$ due to the oxidize of PEI. While neat $In_2O_3$ only show week resonances at 3300~3500 $cm^{-1}$ due to the absorbed water in the sample, doped films clearly shows the amine group peaks at 1560~1640 $cm^{-1}$ and 3200~3400 $cm^{-1}$. These results indicate that, even after 250° C. annealing, substantial amount of amine groups survived the annealing process.

Figure 37:
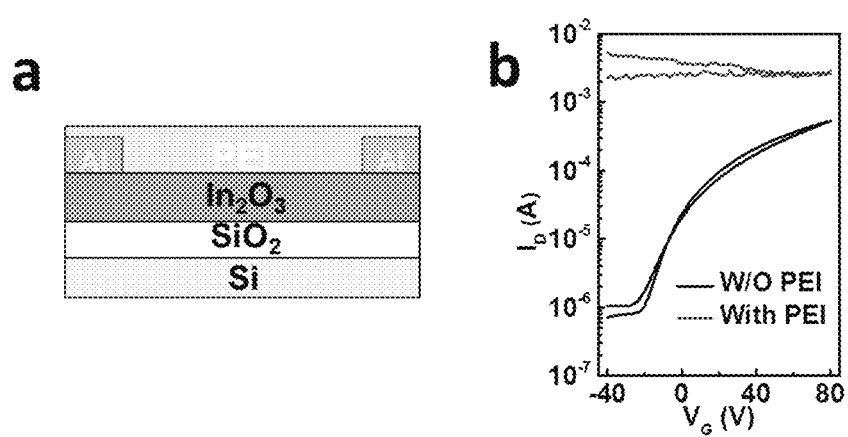
FIG. 37 shows (a) the device structure of an $In_2O_3$ TFT with an overlying PEI layer; and (b) transfer plots of $In_2O_3$ TFT with and without such PEI coating.

To study the doping ability of PEI on MO films, $In_2O_3$ TFTs with and without a spin-coated film of PEI on top of the complete device were fabricated and tested (FIG. 37). Note, the electrical conductivity of a PEI film spin-coated on electrical contacts fabricated on Si/$SiO_x$ substrate is negligible, confirming the insulating nature of this polymer. The I-V curves show that PEI-coated TFTs are heavily doped and cannot be turned off, demonstrating that electron transfer from the amine nitrogen to the MO lattice occurs and it is very efficient. Thus, electron doping of $In_2O_3$ raises the carrier concentration, increasing both off- and on-currents.

In the earlier investigated devices where the PEI is intricately incorporated into the MO lattice (not just as an overlying coating), bulk-heterojunction effects are expected and the PEI clearly is affecting the microstructure of the $In_2O_3$ lattice. Specifically, increasing amounts of PEI are believed to affect charge transport in the $In_2O_3$ lattice in four ways: (1) Charge transfer—PEI should enhance the carrier concentration, increasing both $I_{on}$ and $I_{off}$; (2) Charge scattering—PEI induces elemental film contamination and create charge traps depressing transport; (3) Microstructure—GIXRD experiments clearly suggest that the amorphous portion of the film increases, which should reduce transport efficiency; and (4) Density—Upon PEI doping, the volume fraction of MO will decrease, reducing the carrier density. Thus, as shown in FIGS. 29, 30 and 31, doping of PEI will always decrease the $I_{off}$ of the transistor, however, for very small amount of PEI, the $I_{on}$ and the electron mobility increases. Without wishing to be bound by any particular theory, it is believed that these phenomena are due to the fact that small amounts of PEI result in a positive delicate balance between electron transfer, pre-filling of electron traps, and morphology disruption. As shown by XPS data, PEI content does not seem to affect the level of M-O-M lattice in the blend, which is essential for effective electron-transporting paths.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

What is claimed is:

1. An electronic, optical, or optoelectronic device comprising a metal oxide-polymer blend thin film semiconductor or conductor component, said component comprising a metal oxide lattice and an electrically insulating polymer dispersed therewithin, wherein the metal oxide lattice comprises an electrically semiconducting or conducting metal oxide and wherein the electrically insulating polymer is present at no more than about 20% by weight of the electrically semiconducting or conducting metal oxide.

2. The device of claim 1, wherein the electrically insulating polymer has a dielectric constant of between about 2 and about 10.

3. The device of claim 1, wherein the electrically insulating polymer is selected from the group consisting of polyethyleneimine (PEI), poly(allylamine), polyvinylamine, poly(4-vinyl phenol) (PVP), poly(vinyl alcohol) (PVA), poly(vinyl butyral) (PVB), polystyrene (PS), poly(methyl methacrylate) (PMMA), poly(2-hydroxyethyl methacrylate) (p-HEMA), poly[styrene-co-(4-vinylphenol)], poly(4-vinyl-phenol-co-methyl methacrylate), and polyethylene glycol.

4. The device of claim 1, wherein the electrically insulating polymer is present at no more than about 10% by weight of the electrically semiconducting or conducting metal oxide.

5. The device of claim 1, wherein the electrically insulating polymer is present at no more than about 5% by weight of the electrically semiconducting or conducting metal oxide.

6. The device of claim 1, wherein the electrically semiconducting or conducting metal oxide is in the amorphous state.

7. The device of claim 6, wherein the electrically semiconducting metal oxide is selected from the group consisting of $\alpha$-In$_2$O$_3$, $\alpha$-IZO, $\alpha$-ZTO, $\alpha$-IGO, $\alpha$-IGZO, $\alpha$-SnO$_2$, $\alpha$-NiO, $\alpha$-Cu$_2$O, and $\alpha$-ZnO.

8. The device of claim 6, wherein the electrically conducting metal oxide is selected from the group consisting of $\alpha$-ITO, $\alpha$-ZITO, $\alpha$-GZO, $\alpha$-AZO, $\alpha$-SnO$_2$:F, $\alpha$-GITO, and $\alpha$-CdO.

9. The device of claim 1, wherein the device comprises both a metal oxide-polymer blend thin film semiconductor and a metal oxide-polymer blend conductor component.

10. The device of claim 1, wherein the device comprises a metal oxide dielectric component.

11. The device of claim 10, wherein the metal oxide dielectric component comprises a metal oxide lattice and an electrically insulating polymer dispersed therewithin, wherein the metal oxide lattice comprises an electrically insulating metal oxide and the electrically insulating polymer is present at no more than about 20% by weight of the electrically insulating metal oxide.

12. The device of claim 11, wherein the electrically insulating metal oxide is selected from alumina (Al$_2$O$_3$), cerium oxide (CeO$_x$), yttrium oxide (Y$_2$O$_3$), titanium oxide (TiO$_2$), zirconium oxide (ZrO$_2$), hafnium oxide (HfO$_2$), tantalum oxide (Ta$_2$O$_5$), and barium and strontium titanium oxide ((Ba,Sr)TiO$_3$).

13. The device of claim 1 configured as a metal oxide thin film transistor, the metal oxide thin film transistor comprising a substrate, a gate electrode, a gate dielectric component in contact with the gate electrode, source and drain electrodes, and a metal oxide-polymer blend thin film semiconductor component in contact with the gate dielectric component on one side and the source and drain electrodes on an opposite side.

14. The device of claim 13, wherein the gate electrode comprises a metal oxide-polymer blend thin film conductor.

15. A flexible metal oxide thin film transistor comprising a metal oxide-polymer blend thin film semiconductor component, wherein the metal oxide-polymer blend thin film semiconductor component comprises an amorphous semiconducting metal oxide and an electrically insulating polymer, and wherein the flexible metal oxide thin film transistor is characterized by a charge carrier mobility of at least about 0.04 cm$^2$/Vs and is capable of retaining at least 50% of said charge carrier mobility after 100 cycles of bending and relaxing, said bending comprising bending the flexible metal oxide thin film transistor to a radius ranging from about 5 mm to about 15 mm.

16. The transistor of claim 15, wherein the amorphous semiconducting metal oxide is selected from the group consisting of $\alpha$-In$_2$O$_3$, $\alpha$-IZO, $\alpha$-ZTO, $\alpha$-IGO, $\alpha$-IGZO, $\alpha$-SnO$_2$, $\alpha$-NiO, $\alpha$-Cu$_2$O, and $\alpha$-ZnO, and the electrically insulating polymer is selected from the group consisting of polyethyleneimine (PEI), poly(allylamine), polyvinylamine, poly(4-vinyl phenol) (PVP), poly(vinyl alcohol) (PVA), poly(vinyl butyral) (PVB), polystyrene (PS), poly(methyl methacrylate) (PMMA), poly(2-hydroxyethyl methacrylate) (p-HEMA), poly[styrene-co-(4-vinylphenol)], poly(4-vinyl-phenol-co-methyl methacrylate), and polyethylene glycol.

17. The transistor of claim 15 further comprising a dielectric component comprising an amorphous metal oxide.

18. The transistor of claim 17, wherein the dielectric component comprises an amorphous metal oxide and an electrically insulating polymer.

19. The transistor of claim 15, further comprising a conductor component comprising a transparent conducting thin film.

20. The transistor of claim 19, wherein the transparent conducting thin film comprises an amorphous metal oxide.

* * * * *